US 6,611,455 B2

(12) United States Patent
Sekiguchi et al.

(10) Patent No.: US 6,611,455 B2
(45) Date of Patent: Aug. 26, 2003

(54) MAGNETIC MEMORY

(75) Inventors: Yoshinobu Sekiguchi, Tokyo (JP); Fumihiro Inui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/119,833

(22) Filed: Apr. 11, 2002

(65) Prior Publication Data
US 2002/0154540 A1 Oct. 24, 2002

(30) Foreign Application Priority Data

| Apr. 20, 2001 | (JP) | 2001-122718 |
| Apr. 20, 2001 | (JP) | 2001-122719 |
| Sep. 13, 2001 | (JP) | 2001-277866 |

(51) Int. Cl.[7] .............................................. G11C 11/14
(52) U.S. Cl. ........................ 365/171; 365/173; 365/158
(58) Field of Search ................................ 365/171, 173, 365/158, 66, 55, 87

(56) References Cited

U.S. PATENT DOCUMENTS

| 5,894,447 A | 4/1999 | Takashima ................. 365/158 |
| 6,219,275 B1 | 4/2001 | Nishimura ................. 365/173 |
| 6,385,082 B1 * | 5/2002 | Abraham et al. ........... 365/171 |
| 6,522,575 B2 | 2/2003 | Inui .......................... 365/158 |

OTHER PUBLICATIONS

Moodera, J.S., et al., "Ferromagnetic–Insulator–Ferromagnetic Tunneling: Spin–Dependent Tunneling And Large Magnetoresistance In Trilayer Junctions (invited)," Symposium on Spin Tunneling and Injection Phenomena, 1996 American Institute of Physics, J. Appl. Phys. 79 (8), Apr. 15, 1996, pp. 4724–4729 [S0021–8979 (96)50208–5].

* cited by examiner

Primary Examiner—David Lam

(57) ABSTRACT

A solid-state magnetic memory includes: a substrate; a plurality of memory cells arrayed in a matrix on the substrate, each memory cell including a memory element and an element-selecting device, the memory element including two magnetic layers and a nonmagnetic layer sandwiched between the magnetic layers, the easy magnetization axis of each magnetic layer being directed perpendicular to the plane of the layer; a plurality of bit lines connected to the memory elements for reading out data recorded in the memory elements; and a plurality of write lines placed substantially in the same plane so as to sandwich the memory cell columns, at least one end of each write line being joined to one end of another write line so that a current flows in opposite directions at both sides of each memory cell column.

22 Claims, 25 Drawing Sheets

MAGNETIC MEMORY

BACKGROUND OF THE INVENTION

1. Field of the Invention

The present invention relates to magnetic memories, such as magnetic random access memories (MRAMs), using magnetoresistive elements (hereinafter also referred to as "magnetic memory elements") in which data is written by a magnetization direction and data is read by a magnetoresistance effect.

2. Description of the Related Art

Although a MRAM is a solid-state memory with no active parts as in the case of a semiconductor memory, in the MRAM, data is not lost even if a power supply is cut off, rewriting can be performed for an unlimited number of times, and there is no danger that memory contents may disappear due to exposure to radiation, all of which are advantageous in comparison with the semiconductor memory.

As the memory element used for the MRAM, a magnetoresistive element is preferably used, in which an external magnetic field is applied to the magnetic layers while a predetermined current is applied between the magnetic layers, the resistance changes in response to the relative angle between the magnetization directions of both magnetic layers. When the magnetization directions of the magnetic layers are parallel to each other (i.e., the magnetization directions of the magnetic layers are the same), the minimum resistance occurs, and when the magnetization directions are antiparallel to each other (i.e., the magnetization directions of the magnetic layers are opposite to each other), the maximum resistance occurs.

Accordingly, by using the magnetic layers having different coercive forces, the parallel state and the antiparallel state can be brought about in response to the strength of the magnetic field, and thus the magnetization state can be sensed by the change in resistance.

Recently, tunneling magnetoresistive (TMR) elements have been developed, in which a surface-oxidized Al film is used as the tunneling barrier layer sandwiched between two magnetic layers, resulting in a magnetic memory element exhibiting a rate of change in magnetoresistance of approximately 20%. Therefore, it is highly possible to apply the tunneling magnetoresistive element in magnetic heads and magnetic memory elements. Magnetoresistive elements exhibiting such a large rate of change in magnetoresistance have been reported, for example, in the Journal of Applied Physics, vol. 79, 4724 4729, 1996. With respect to memory elements used for magnetic memories, U.S. Pat. No. 6,219,275 discloses a magnetic memory using a magnetoresistive element in which perpendicular magnetization films are used as magnetic films.

In order to write data in a MRAM, currents are passed through lines placed in the vicinity of the individual memory cells to generate magnetic fields, and since the magnetization directions of magnetic layers (memory layers) are determined by the magnetic fields, data is written. Therefore, in order to perform writing, currents which can generate magnetic fields sufficient for reversing the magnetization directions of the memory layers must be passed through the lines. For that purpose, considerably large currents of approximately several to 10 mA are required.

In order to reduce a current to be passed through the lines during writing, for example, U.S. Pat. No. 5,894,447 discloses a configuration in which in-plane magnetization films are used as the magnetic layers, upper and lower write word lines are placed so as to sandwich the magnetic layers, and the ends of the upper and lower write word lines are connected to each other so that the current flows from the upper write word line to the lower write word line in a turn-back manner.

FIGS. 12A to 12C are schematic diagrams showing a configuration of a conventional magnetic memory. FIG. 12A is a sectional view of a memory cell, FIG. 12B is a plan view showing a plurality of memory cells adjacent to each other, and FIG. 12C is a sectional view of a cell array along word lines. FIG. 12C also shows a drive circuit for driving the word lines.

As shown in FIGS. 12A and 12B, in each memory cell 36, bit lines 31 are placed orthogonally to an upper word line 32 and a lower word line 33 formed above and below the bit lines 31, respectively. A giant magneto-resistance (GMR) film 34 is formed at the intersection, both ends of the GMR film 34 being connected to the bit lines 31. That is, the upper word line 32 is formed directly above the GMR film 34, and the lower word line 33 is formed beneath the GMR film 34. The upper word line 32 and the lower word line 33 overlap in the vertical direction with the GMR film 34 and interlayers therebetween. The interlayers electrically insulate the upper word line 32 from the lower word line 33 and electrically insulate the upper and lower word lines 32 and 33 from the GMR film 34 and the bit lines 31.

When a current is passed through the upper word line 32 of the memory cell 36, for example, toward the front as shown in FIG. 12A by a circular mark having a dot therein, and a current is passed through the lower word line 33 toward the back as shown in FIG. 12A by a circular mark having a cross therein, both magnetic fields generated by the currents flowing through the upper word line 32 and the lower word line 33 are directed rightward in the drawing in accordance with the Ampere's corkscrew rule. As a result, a combined magnetic field is produced by combining the magnetic fields generated by the currents flowing through the upper word line 32 and the lower word line 33, and the combined magnetic field is applied to the GMR film 34. The combined magnetic field applied to the GMR film 34 has a magnetic intensity approximately twice the intensity of the magnetic field generated by one word line on the assumption that the magnitude of the current supplied is the same.

For example, as shown in FIG. 12C, in a memory cell array including memory cells 36a to 36l, the upper word line 32 and the lower word line 33 are extended from the memory cell 36a on the extreme left to the memory cell 36l on the extreme right, and the upper word line 32 and the lower word line 33 are connected in series by a contact 37 at the left edge of the cell array. Furthermore, the right ends of the upper and lower word lines 32 and 33 are connected to a drive circuit 35, and a current is supplied in the directions indicated by the arrows in the drawing by applying voltages V1 and V2 thereto.

As a result, at the same current consumption as in the case of a traditional magnetic memory, the combined magnetic field having a magnetic intensity approximately twice the magnetic intensity in the traditional magnetic memory can be produced by the current flowing through both word lines.

However, in the configuration which uses the in-plane magnetization films as the magnetic layers and in which word lines are provided so as to sandwich the memory cells as described above, the fabrication process is difficult, for example, because the upper lines and the lower lines must be connected to each other at the ends by through holes or the like. Additionally, parasitic capacitance occurs between the upper word lines and the lower word lines, which may give rise to a problem, in particular, when high-speed driving is performed. Moreover, because of the multilayered structure, the aspect ratio (x/y shown in the drawing) of the lines tends to increase, and therefore, it is difficult to decrease the opposing areas of the upper and lower word lines which are directly related to parasitic capacitance.

Additionally, when the in-plane magnetization films are used for memory cells, it is difficult to miniaturize the memory elements under the influence of curling of magnetization, etc. In order to solve this problem, the configuration in which perpendicular magnetization films are used as the magnetic layers as disclosed in U.S. Pat. No. 6,219,275 may be employed. However, since the intensity of magnetic fields for reversing the magnetization is increased as memory elements are further miniaturized in the future, large currents are needed particularly for reversing the magnetization in the data-writing process, resulting in a difficulty in saving power. In such a case, when a plurality of write lines are provided for each memory element in order to apply a large magnetic field to one memory element, since a drive circuit is connected to each write line, the number of drive circuits is increased and the area of the circuits in the periphery of the memory is increased.

SUMMARY OF THE INVENTION

It is an object of the present invention to provide a magnetic memory in which data is retained stably even if the memory element is miniaturized, which can be operated with low power usage, and which can be fabricated by a simple fabrication process.

It is another object of the present invention to reduce the area of the circuits in the periphery of the memory.

In one aspect of the present invention, a solid-state magnetic memory includes: a substrate; a plurality of memory cells arrayed in a matrix on the substrate, each memory cell including a memory element and an element-selecting device, the memory element including two magnetic layers and a nonmagnetic layer sandwiched between the magnetic layers, the easy magnetization axis of each magnetic layer being directed perpendicular to the plane of the layer; a plurality of bit lines connected to the memory elements for reading out data recorded in the memory elements; and a plurality of write lines placed substantially flush so as to sandwich the memory cell columns, at least one end of each write line being joined to one end of another write line so that a current flows in opposite directions at both sides of each memory cell column.

In another aspect of the present invention, a method for making the solid-state magnetic memory includes the step of forming the write lines by patterning using the same mask so that the write lines are formed substantially flush. Consequently, the write lines and the joints thereof can be formed by one process.

In another aspect of the present invention, a solid-state magnetic memory includes a plurality of memory cells arrayed in a matrix, each memory cell including a memory element composed of a magnetoresistive element and an element-selecting device, the magnetoresistive element including two magnetic layers and a nonmagnetic layer sandwiched between the magnetic layers, the easy magnetization axis of each magnetic layer being directed perpendicular to the plane of the layer, in which write lines shared by two adjacent memory element columns are placed, both ends of the shared write lines being joined to the ends of other write lines so that a current flows with two memory element columns therebetween, the other ends of the other write lines being joined to a drive circuit and a power supply circuit, and thereby two adjacent memory elements in the memory element columns placed at both sides of the shared write line are complementarily operated to write one bit of data.

In another aspect of the present invention, an information device includes the solid-state magnetic memory as a built-in memory.

Further objects, features and advantages of the present invention will become apparent from the following description of the preferred embodiments with reference to the attached drawings.

DESCRIPTION OF THE PREFERRED EMBODIMENTS

Figure 1:
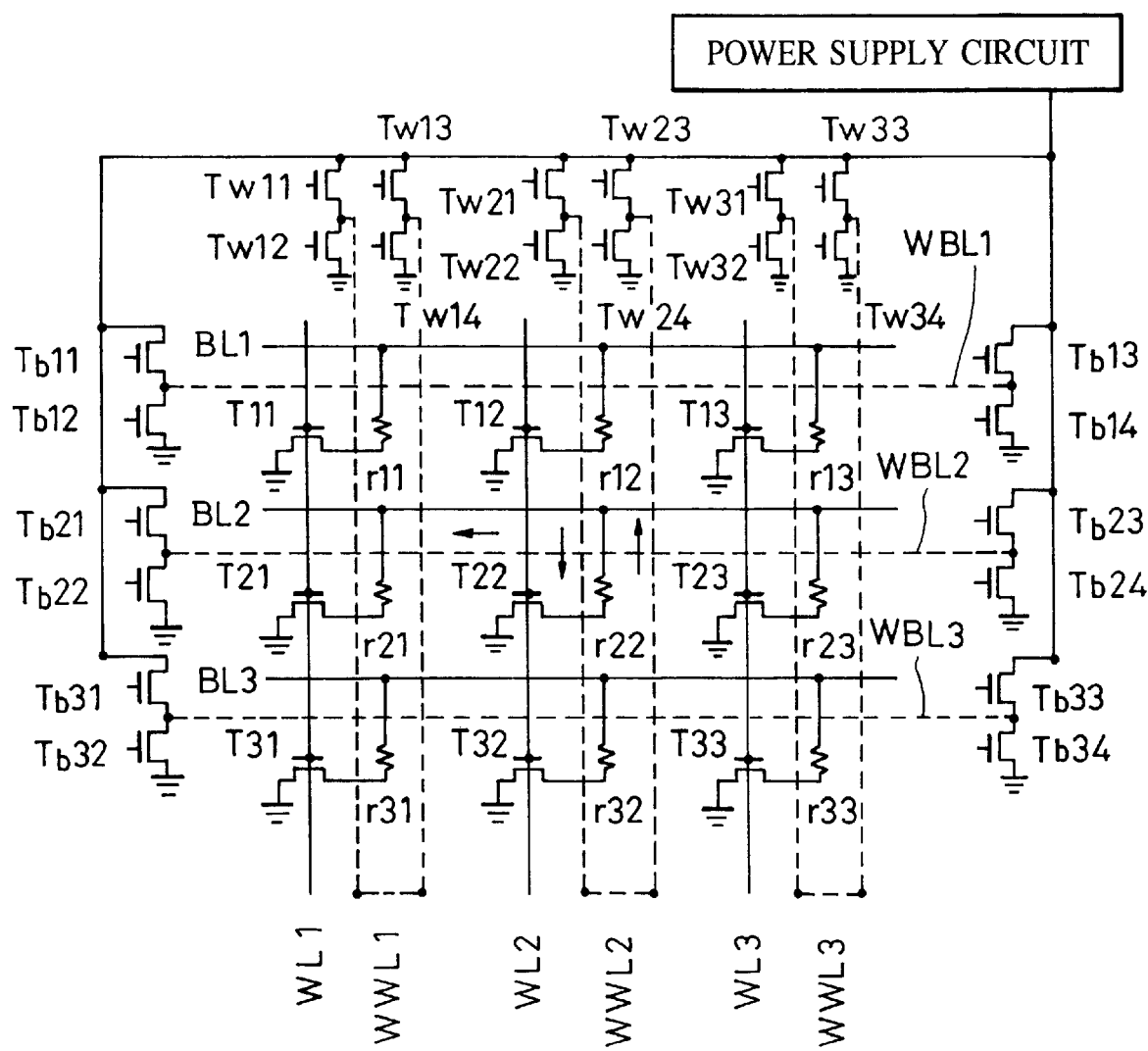
FIG. 1 is a circuit diagram showing a section mainly participating in writing of data in a magnetic memory in a first embodiment of the present invention.

The embodiments of the present invention will be described with reference to the attached drawings. In this specification, with respect to the number of lines, for example, with respect to the number of write lines, a line placed between two adjacent memory element columns is considered to be one line as a matter of convenience.
First Embodiment FIG. 1 is a circuit diagram showing a MRAM in a first embodiment of the present invention, in which a section mainly participating in writing of data is illustrated.

In this embodiment, the MRAM includes a memory cell array in which memory cells, each including a magnetoresistive element and an element-selecting device, are arrayed in a 3×3 matrix; read bit lines BL1, BL2, and BL3; read word lines WL1, WL2, and WL3; write bit lines WBL1, WBL2, and WBL3; and write word lines WWL1, WWL2, and WWL3.

One of the memory cells includes a field effect transistor (FET) T11 as the element-selecting device and a memory element r11 as the magnetoresistive element corresponding thereto. Although a tunneling magnetoresistive (TMR) element is described as the memory element, the present invention is not limited thereto, and any memory element in which the magnetization directions are perpendicular to the planes of the layers is acceptable.

Similarly, the other memory cells include field effect transistors FETs T12, T13, T21, T22, T23, T31, T32, and T33 as the element-selecting devices and memory elements r12, r13, r21, r22, r23, r31, r32, and r33 as the magnetoresistive elements. Each memory element is a perpendicular magnetization TMR element having a configuration including a tunneling barrier layer and two magnetic layers sandwiching the tunneling barrier layer, the easy magnetization axis of each magnetic layer being directed perpendicular to the plane of the layers (in the thickness direction), in which one of the magnetic layers is used as a memory layer, and the electrical resistance changes by selecting the magnetization direction of the memory layer.

For example, a thin aluminum oxide film with a thickness of 0.5 to 2 nm may be used as the tunneling barrier layer, and ferrimagnetic films having easy magnetization axes directed perpendicular to the planes of the films may be used as the magnetic layers. Preferable examples of the material for the ferrimagnetic films include GdFe, GdFeCo, TbFe, TbFeCo, DyFe, and DyFeCo containing Gd, Tb, or Dy which is a rare-earth element, because they are easy to produce and the physical properties, such as magnetization and coercive force, can be easily controlled. When data is written in the memory element, the data is written as a magnetization direction of the memory layer. Since the magnetization direction of the memory layer is retained unless an external magnetic field having a larger magnitude than that of the reversing magnetic field is applied thereto, each memory element performs as a nonvolatile memory.

On the other hand, reading of data from the memory element is performed based on the fact that the value of the tunneling current flowing through the tunneling barrier layer differs depending on whether the magnetization directions of the two magnetic layers are parallel or antiparallel to each other.

The read bit lines are arranged parallel to each other, and the read word lines are arranged parallel to each other and orthogonally to the read bit lines, and are also joined to the control electrodes of the element-selecting devices, e.g., the gates of FETs. The write bit lines are arranged parallel to each other and also parallel to the read bit lines. The write word lines are arranged parallel to each other and orthogonally to the write bit lines and the read bit lines.

The drain of each FET for element selection is connected to one of the terminals of the corresponding memory element. In the FETs T11, T21, and T31, the gate terminals are connected to the read word line WL1 and the source terminals are grounded. In the FETs T12, T22, and T32, the gate terminals are connected to the read word line WL2 and the source terminals are grounded. In the FETs T13, T23, and T33, the gate terminals are connected to the read word line WL3 and the source terminals are grounded. The voltages applied to the gate electrodes and source electrode and the connections are not particularly limited in the present invention.

The other terminals of the memory elements r11, r12, and r13 are connected to the read bit line BL1. The other terminals of the memory elements r21, r22, and r23 are connected to the read bit line BL2. The other terminals of the memory elements r31, r32, and r33 are connected to the read bit line BL3.

A simple drive circuit, for example, including four FETs Tw11, Tw12, Tw13, and Tw14, is joined to the write word line WWL1 in order to pass a write current in two directions. Similarly, a simple drive circuit including four FETs Tw21, Tw22, Tw23, and Tw24 is joined to the write word line WWL2, and a simple drive circuit including four FETs Tw31, Tw32, TW33, and Tw34 is joined to the write word line WWL3. The FETs Tw11, Tw12, Tw13, Tw14, Tw21, Tw22, Tw23, Tw24, Tw31, Tw32, TW33, and Tw34 act as switching elements, and when the FETs diagonally placed are switched on simultaneously, a current flows through the corresponding write word line. For example, when the FETs Tw21 and Tw24 are switched on simultaneously, a current flows through the write word line WWL2.

A simple drive circuit including four FETs Tb11, Tb12, Tb13, and Tb14 is joined to the write bit line WBL1 in order to pass a write current in two directions. Similarly, a drive circuit including the FETs Tb21, Tb22, Tb23, and Tb24 is joined to the write bit line WBL2, and a drive circuit including the FETs Tb31, Tb32, Tb33, and Tb34 is joined to the write bit line WBL3. Additionally, these drive circuits are connected to a power supply circuit.

The FETs Tb11, Tb12, Tb13, Tb14, Tb21, Tb22, Tb23, Tb24, Tb31, Tb32, Tb33, and Tb34 act as switching elements, and when the FETs placed at both ends of a write bit line are switched on simultaneously, a current flows through the corresponding write bit line. For example, when the FETs Tb22 and Tb23 are switched on simultaneously, a current flows through the write bit line WBL2.

Additionally, the individual memory elements and FETs described above are preferably formed on a semiconductor substrate in view of operation, etc.

The operation of the MRAM having the configuration described above will be described below.

First, writing of data in the memory elements in the memory cells will be described. Herein, writing of data in the memory element r22 will be described. The data is written as a magnetization direction of the memory layer which is one of the magnetic layers constituting the memory element r22.

First, in the FETs joined to the write word line WWL2, the FETs Tw21 and Tw24 are switched on. Thereby, a current is supplied from the FET Tw21 to the FET Tw24 so as to flow along the left side of the second memory element column including the memory elements r12, r22, and r32 and to return along the right side of the second memory element column.

At this stage, magnetic fields directed in the same direction (from the back toward the front) are simultaneously applied to the memory elements constituting the second memory element column by the current flowing downward and the current flowing upward shown in FIG. 1. In this state, the magnetic fields with substantially the same magnitude are applied to the memory elements r12, r22, and r32 in the second column.

Thereby, a larger magnetic field can be applied perpendicular to the planes of the layers in each memory element compared to the configuration in which one write word line is used with the same current.

Moreover, compared to the configuration in which currents are passed in the opposite directions through the separate write word lines which are placed at both sides of memory elements (a drive circuit is joined to each write word line), since the number of drive circuits can be decreased by half, it is possible to simplify the circuits in the periphery of the memory.

Next, the FETs connected to the write bit line WBL2 are switched on. Thereby, a current flows through the write bit line WBL2 from the FET Tb23 to the FET Tb22. The magnetic field generated by the current flowing through the write bit line WBL2 is directed from the back toward the front, which is the same direction as the direction of the magnetic field generated by the write word line WWL2. Therefore, a magnetic field sufficient for reversing just the memory layer of the memory element r22 is applied, and the data is written.

Next, reading of the data written in the memory element in the memory cell as a magnetization direction will be described. Herein, reading of the data written as the magnetization direction in the memory element r22 will be described.

First, a voltage is applied to the read bit line BL2 by a read drive circuit connected to the read bit line BL2.

Next, when a voltage is applied to the read write line WL2 to switch on the FET T22, since the potential of the read bit line BL2 changes, the potential is inputted to a sense amplifier (not shown in the drawing).

The sense amplifier compares the potential of the read bit line BL2 with the reference potential, and thus the magnetization state of the memory layer of the memory element r22 is sensed. At this stage, if the potential of the read bit line BL2 is higher than the reference potential, the magnetization directions of the magnetic layers of the memory element is considered to be antiparallel to each other, and if the potential of the read bit line BL2 is lower than the reference potential, the magnetization directions of the magnetic layers of the memory element are considered to be parallel to each other. In this way, the magnetization state of the memory layer of the memory element r22 can be sensed depending on the difference between the potential of the read bit line BL2 and the reference potential.

Next, the cell structure of the memory cell will be described in detail.

Figure 2:
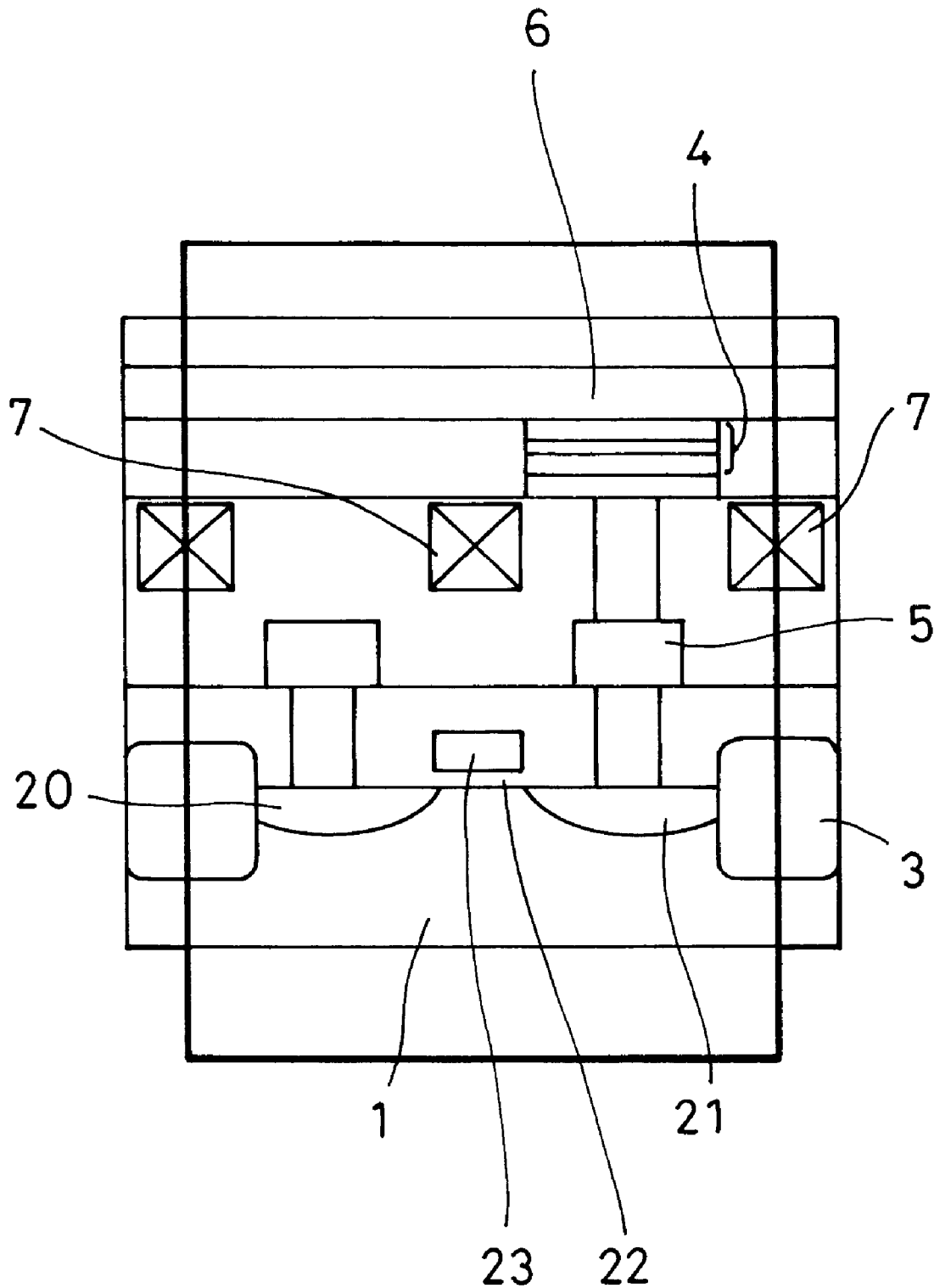
FIG. 2 is a sectional view showing a cell structure of the memory cell including the memory element and field effect transistor shown in FIG. 1.

FIG. 2 is a sectional view showing a cell structure of the memory cell including the memory element and the field effect transistor as the element-selecting device shown in FIG. 1.

As shown in FIG. 2, on a p-type silicon substrate 1, an embedded element isolation region 3 composed of $SiO_2$, n-type diffusion regions 20 and 21 for forming a source and a drain of a FET acting as a switching element, a gate insulating film 22 composed of $SiO_2$, and a gate electrode 23 composed of polysilicon are formed.

A memory element 4 uses a tunneling magnetoresistive film and includes an aluminum oxide layer with a thickness of approximately 1 nm sandwiched by two ferrimagnetic layers having easy magnetization axes directed perpendicular to the planes of the films, ferrimagnetic layers being a GdFe layer and a TbFe layer. One end of the memory element 4 is connected to the n-type diffusion region 21 with a local conductor 5 composed of TiN therebetween, and the other end is connected to a read bit line 6 composed of Ti/AlSiCu/Ti. In this case, preferably, the TbFe layer having a large coercive force is used as a pinned magnetization layer and the GdFe layer having a small coercive force is used as a memory layer because the current required for reversing the magnetization can be reduced.

Write word lines 7 are placed so as to sandwich the memory element 4 at the p-type silicon substrate 1 side. This configuration can be formed more easily compared to the configuration in which the memory element is in the same plane with the write word lines. Of course, it is possible to fabricate the write word lines 7 flush with the memory element 4 so that a magnetic field can be efficiently applied to the memory element 4.

Since a current flows through one of the write word lines 7 and returns through the other write word line 7, the current flows in opposite directions at the right and left sides of the memory element 4. The magnetic fields induced from the pair of write word lines 7 are directed in the same direction for the memory element 4, and a combined magnetic field is applied to the memory element 4. Therefore, compared to the case in which a magnetic field is induced by one write word line, it is possible to induce the same magnetic field by half the current. Additionally, when the magnetic field for reversing the magnetization is large, such as in the case of using perpendicular magnetization films for the memory element or miniaturizing the element, it is possible to apply a large magnetic field to the memory element by a small current.

Figure 12A:
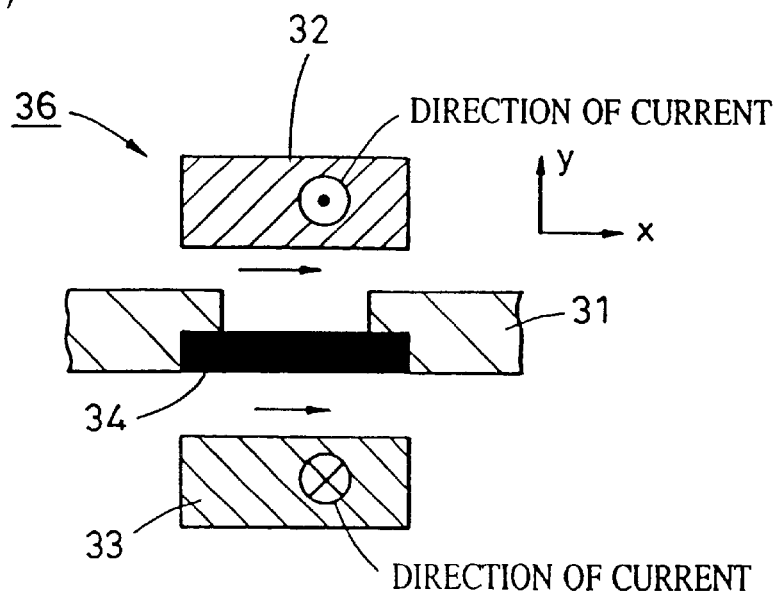
FIG. 12A is a sectional view of a memory cell in a conventional magnetic memory.
Figure 12B:
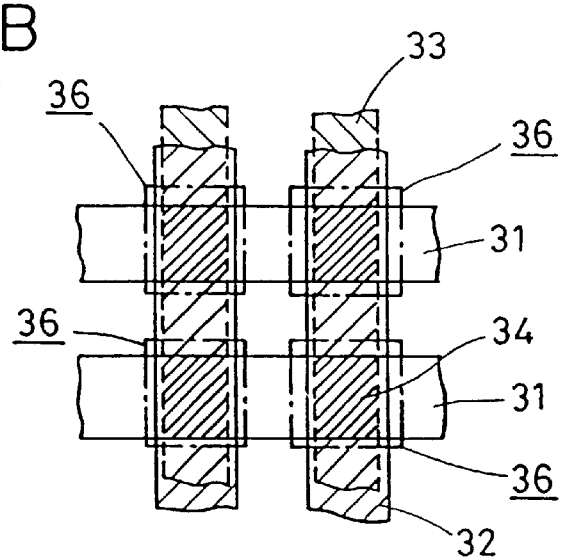
FIG. 12B is a plan view showing the adjacent memory cells in the conventional magnetic memory.
Figure 12C:
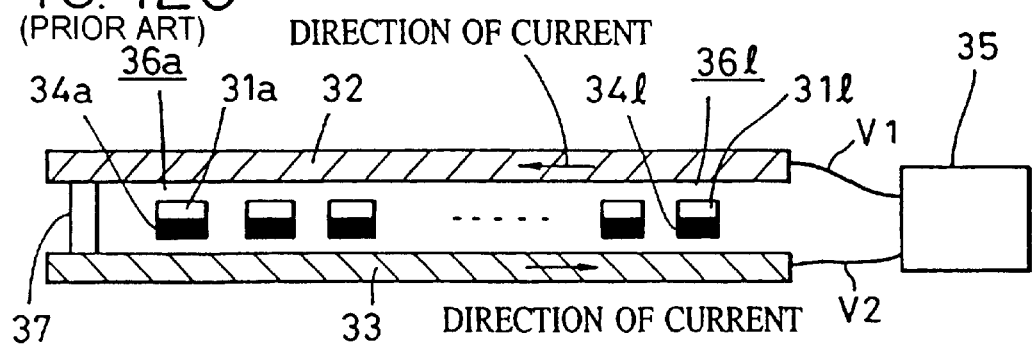
FIG. 12C is a sectional view of a cell array along word lines in the conventional magnetic memory.

In this embodiment, since all the write word lines 7 can be placed on the same plane, it is possible to form the write word lines and the joints thereof by one process, by only changing a mask pattern. As described above, when the memory element is a magnetoresistive element using in-plane magnetization films, a plurality of word line layers are provided in the deposition direction. Compared to such a configuration, it is possible to greatly simplify the process in this embodiment. Additionally, since it is possible to decrease the areas of the individual write word lines facing each other with the memory element column therebetween, in comparison with the configuration shown in FIG. 12, it is possible to easily reduce the parasitic capacitance. This is because when the sectional area of the line is determined by the current value, the length in the in-plane direction (X direction in FIG. 12), which is relatively easy to control the length, is increased so that a predetermined current flows and the length (area) of the planes facing the adjacent line is decreased, and thereby the parasitic capacitance can be controlled.

Accordingly, in the MRAM using the memory element including in-plane magnetization films, since the configuration in which the write word line 7 is turned back can be fabricated without a new process, it is possible to reduce the write current or decrease the number of drive circuits without any demerits in the fabrication process.

A write bit line (not shown in the drawing) is placed on the front side or the back side so that the current flowing through the write bit line generates a magnetic field primarily perpendicular to the planes of the films of the memory element 4. When the magnetic field generated by the write bit line and the magnetic field generated by the write word line 7 are in the same direction, the magnetic field for changing the magnetization direction in the memory element may be set so that a combined magnetic field has a sufficient magnitude for changing the magnetization direction of the memory layer of the memory element.

In this embodiment, although a write word line WWL current flows round the memory element, the write bit line WBL current may be also flowed round the memory element. In such a configuration, a necessary magnetic field can be generated with approximately half the current.

Second Embodiment

Figure 3:
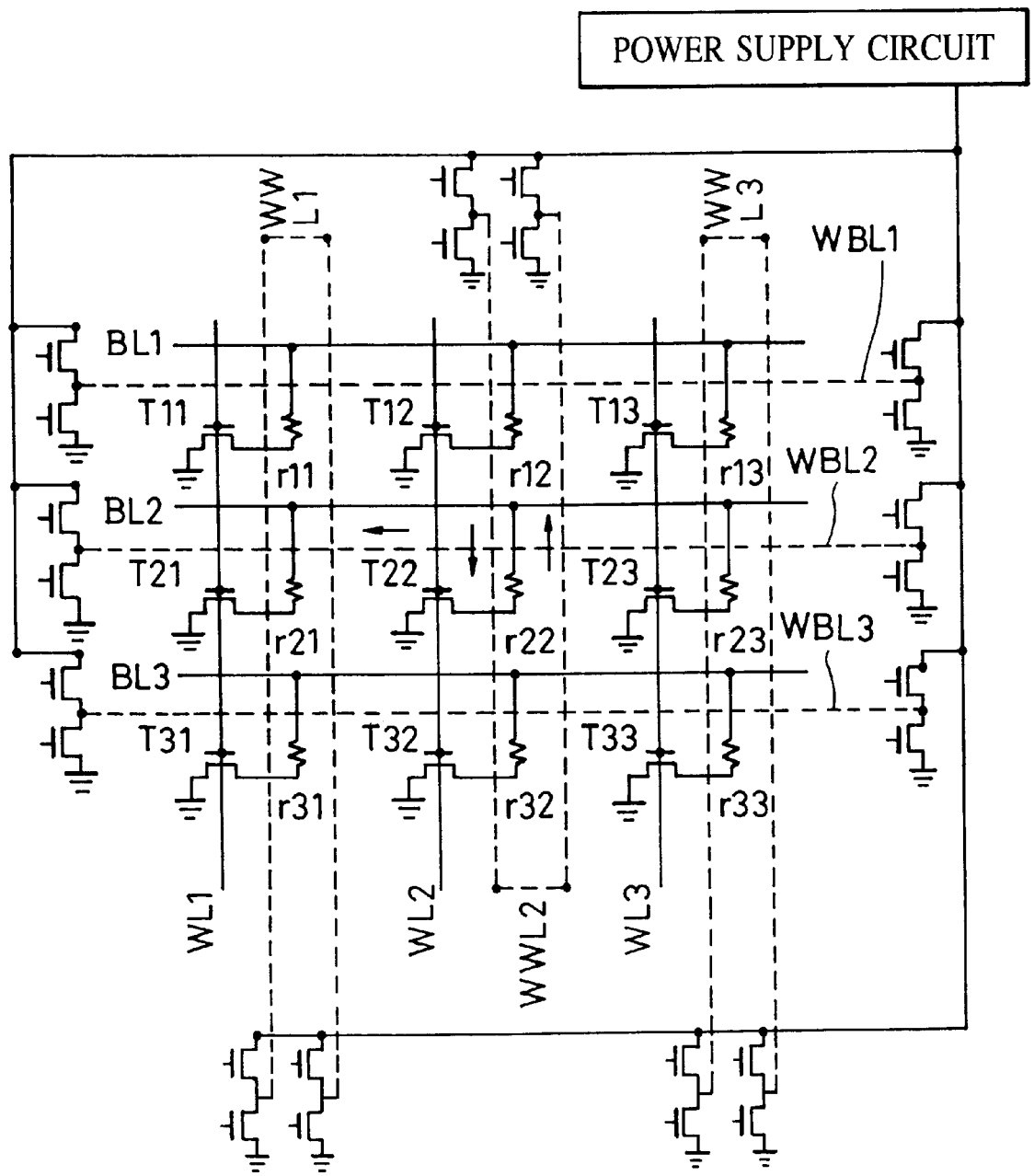
FIG. 3 is a circuit diagram showing a section mainly participating in writing of data in a magnetic memory in a second embodiment of the present invention.

FIG. 3 is a circuit diagram showing a section mainly participating in writing of data in a MRAM in a second embodiment of the present invention. In FIG. 3, the same elements of the MRAM are represented by the same numerals as those of the MRAM shown in FIG. 1.

In this embodiment, drive circuits for supplying currents to the write word lines are alternately placed on opposite ends outside the memory cell array area, while in the first embodiment, the drive circuits for supplying currents to the write word lines are placed on one of the ends outside the memory cell array area. In the second embodiment, when relatively large write currents are supplied from the power supply circuit through the drive circuits, it is easy to secure the areas necessary for the drive circuits, the area occupied by the peripheral circuits can be reduced, and uniform heat generation can be achieved. In particular, one-sided temperature distribution due to the one-sided placement of the peripheral circuits may cause variations in physical properties, such as coercive force and magnetization, on the array, resulting in improper operating signals. In such a case, the configuration in this embodiment is particularly preferable.

Third Embodiment

In the first embodiment, four FETs are connected to each write word line and four FETs are connected to each write bit line so that the write current can be supplied reversibly. However, in order to supply a common write current to at least one of the individual write word lines and the individual write bit lines, a push-pull power supply may be used.

Figure 4A:
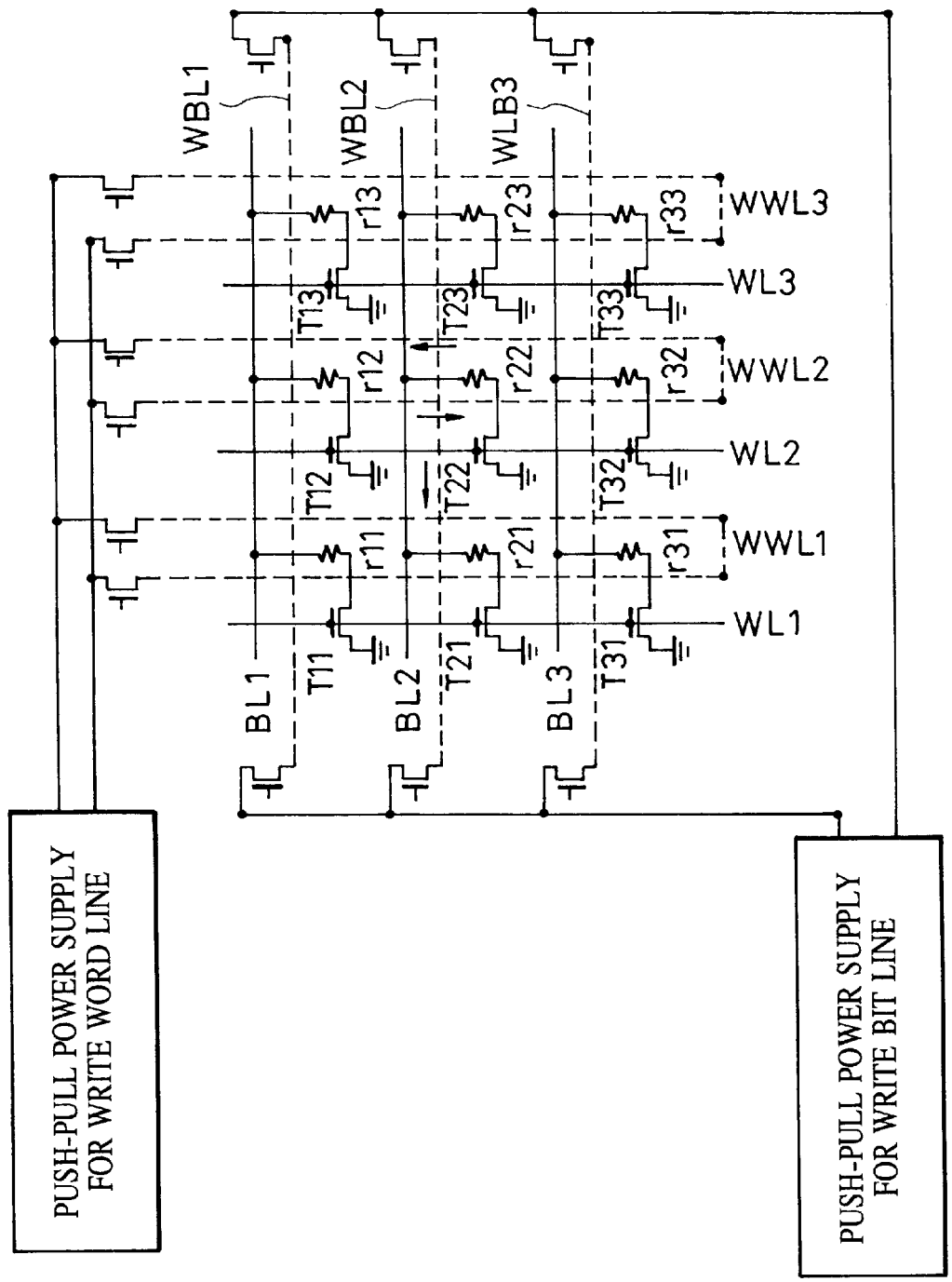
FIG. 4A is a circuit diagram showing a section mainly participating in writing of data in a magnetic memory in a third embodiment of the present invention.
Figure 4B:
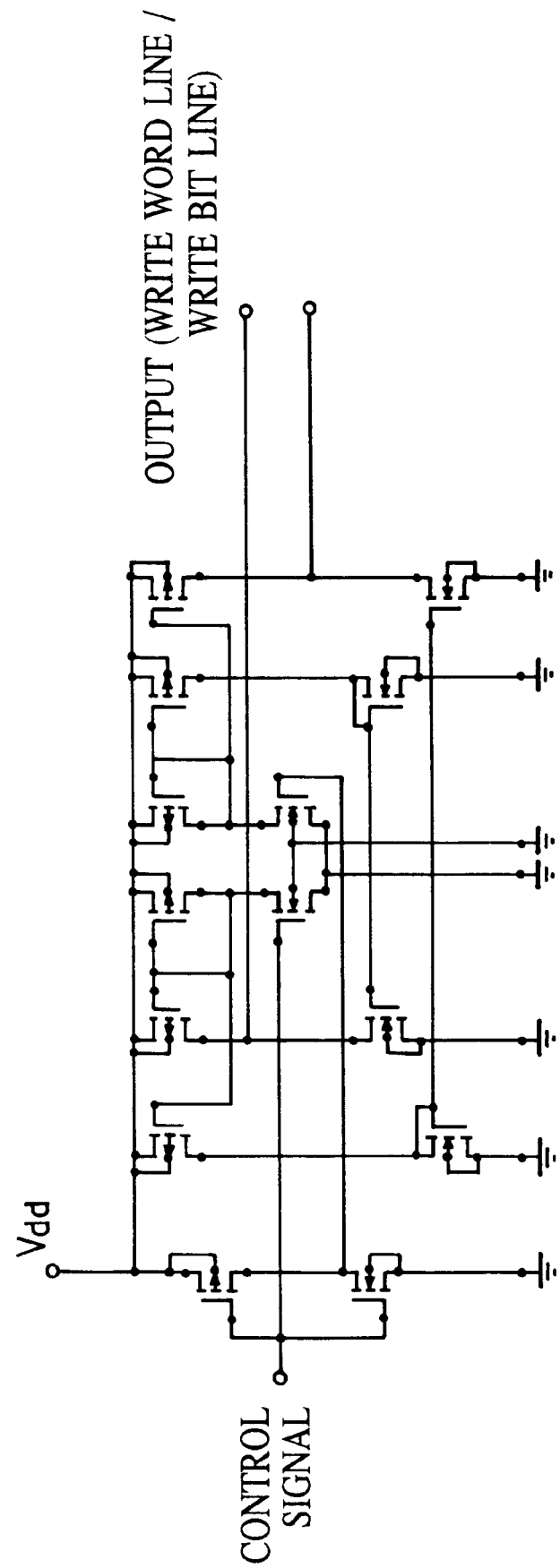
FIG. 4B is a circuit diagram showing a push-pull power supply in the magnetic memory shown in FIG. 4A.

FIG. 4A is a circuit diagram showing a section mainly participating in writing of data in a MRAM, and FIG. 4B is a circuit diagram showing an example of the push-pull power supply for write word lines and the push-pull power supply for write bit lines shown in FIG. 4A. In FIG. 4A, the same elements are represented by the same numerals as those of the MRAM shown in FIG. 1.

As shown in FIG. 4A, the MRAM in this embodiment includes a push-pull power supply for write word lines for supplying the current reversibly to each write word line and a push-pull power supply for write bit lines for each write bit line. Furthermore, two FETs are provided on each write word line and two FETs are provided on each write bit line, the FETs acting as switches for selecting lines to which write currents are supplied.

In order to supply the current reversibly to each write word line or to each write bit line in response to the input control signal, a push-pull power supply as shown in FIG. 4B may be used.

As described above, in this embodiment, when the memory scale is increased, the peripheral circuits can be composed of a smaller number of FETs. However, a write current is supplied to only one write line at a time.

Additionally, although the common write current is supplied reversibly both to the individual write word lines and to the individual write bit lines in this embodiment, a configuration is also acceptable in which the common write current is supplied reversibly to at least one of the individual write word lines and the individual write bit lines.

Fourth Embodiment

Figure 5:
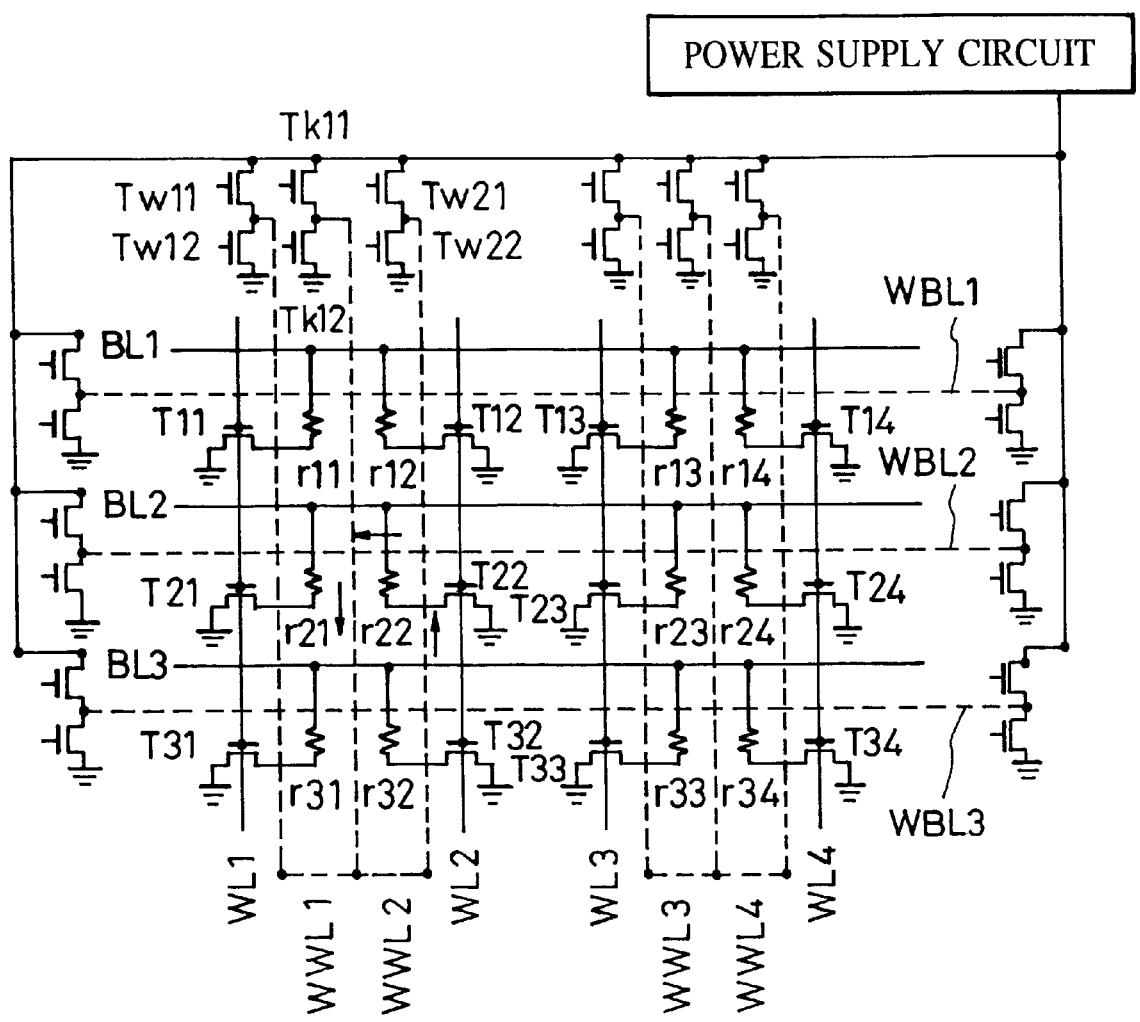
FIG. 5 is a circuit diagram showing a section mainly participating in writing of data in a magnetic memory in a fourth embodiment of the present invention.

FIG. 5 is a circuit diagram showing a section mainly participating in writing of data in a MRAM in a fourth embodiment of the present invention. In FIG. 5, the same elements of the MRAM are represented by the same numerals as those of the MRAM shown in FIG. 1.

In the MRAM in this embodiment, a first memory element column including memory elements r11, r21, and r31 and a second memory element column including memory elements r12, r22, and r32 share parts of write word lines WWL1 and WWL2, and a third memory element column including memory elements r13, r23, and r33 and a fourth memory element column including memory elements r14, r24, and r34 share parts of write word lines WWL3 and WWL4.

Consequently, for example, the number of write word lines connected to the first memory element column and the second memory element column can be decreased from four to three, and furthermore, the number of FETs connected to the write word lines WWL1 and WWL2 can be decreased from eight to six.

In the memory elements r12, r22, and r32 constituting the second memory element column, when data is written in the memory element r22, FETs Tw11 and Tw12 which are connected to the write word line WWL1 only are switched off. A FET Tk11 shared by the write word lines WWL1 and WWL2 is switched on, and a FET Tw22 connected to the write word line WWL2 only is switched on. Thereby, the write word line WWL2 current flows from the FET Tk11 to the FET Tw22 round the memory elements r12, r22, and r32 constituting the second memory element column.

On the other hand, when data is written in any one of the memory elements r11, r21, and r31 constituting the first memory element column, the FETs Tw21 and Tw22 connected to the write word line WWL2 only are switched off, and a current is passed through the write word line WWL1.

As described above, in this embodiment, since the number of write word lines can be further decreased compared to the configuration in the first embodiment, the cell area of the memory cell can be reduced.

Although one end of the write word line is joined to a drive circuit for supplying a write current, as the number of write word lines is decreased, the number of FETs constituting the drive circuits can also be decreased.

Since a write current is relatively large, FETs constituting a drive circuit must be suitable for large current, and the area occupied by the drive circuit is also increased. However, in this embodiment, since the number of FETs for large current can be decreased, the area of the peripheral circuits of the memory can be greatly reduced.

Next, the cell structure of the memory cell will be described in detail.

Figure 6:
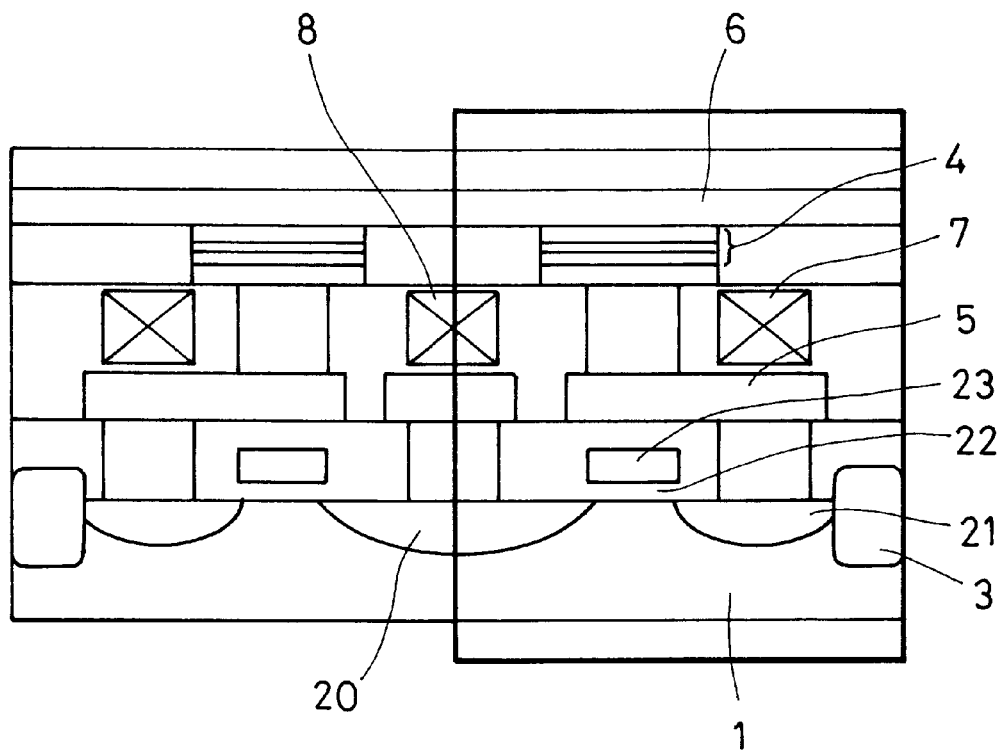
FIG. 6 is a sectional view showing a cell structure of the memory cells including the memory elements and field effect transistors shown in FIG. 5.

FIG. 6 is a sectional view showing a cell structure of the memory cell including the memory element and the field effect transistor FET as the element-selecting device shown in FIG. 5. In FIG. 6, the same elements are shown by the same numerals as those of the memory cell shown in FIG. 2.

A shown in FIG. 6, two FETs share an n-type diffusion region 20 for forming a source, and a write word line 8 shared by two memory element columns is placed above the n-type diffusion region 20.

Consequently, the common line can be arranged at substantially the same distance from the two memory element columns, and the area occupied by one memory cell can be reduced.

In this embodiment, although two FETs share the n-type diffusion region 20 for forming the source, two FETs may share an n-type diffusion region 21 for forming a drain.

Figure 7:
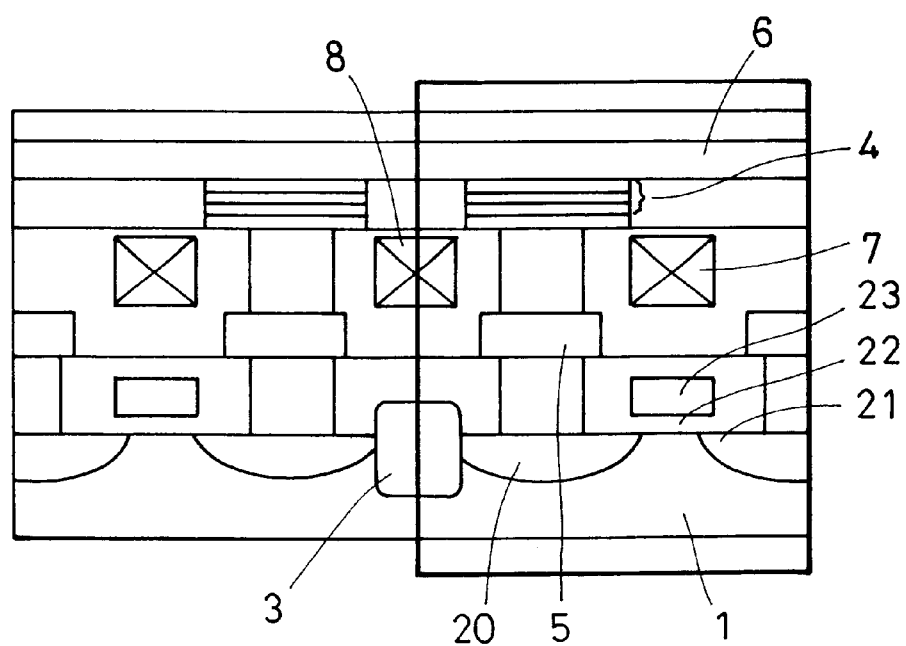
FIG. 7 is a sectional view showing another cell structure of the memory cells including the memory elements and field effect transistors shown in FIG. 5.

FIG. 7 is a sectional view showing another cell structure of the memory cell. In FIG. 7, the same elements are shown by the same numerals as those of the memory cell shown in FIG. 2.

As shown in FIG. 7, although two FETs share an n-type diffusion region 20 for forming a source, a write word line 8 shared by two memory element columns is placed above an element isolation region 3 which isolates the two FETs from each other.

Consequently, the common line can be arranged at substantially the same distance from the two memory element columns, and the area occupied by one memory cell can be reduced in the same manner as the cell structure shown in FIG. 6.

Figure 8:
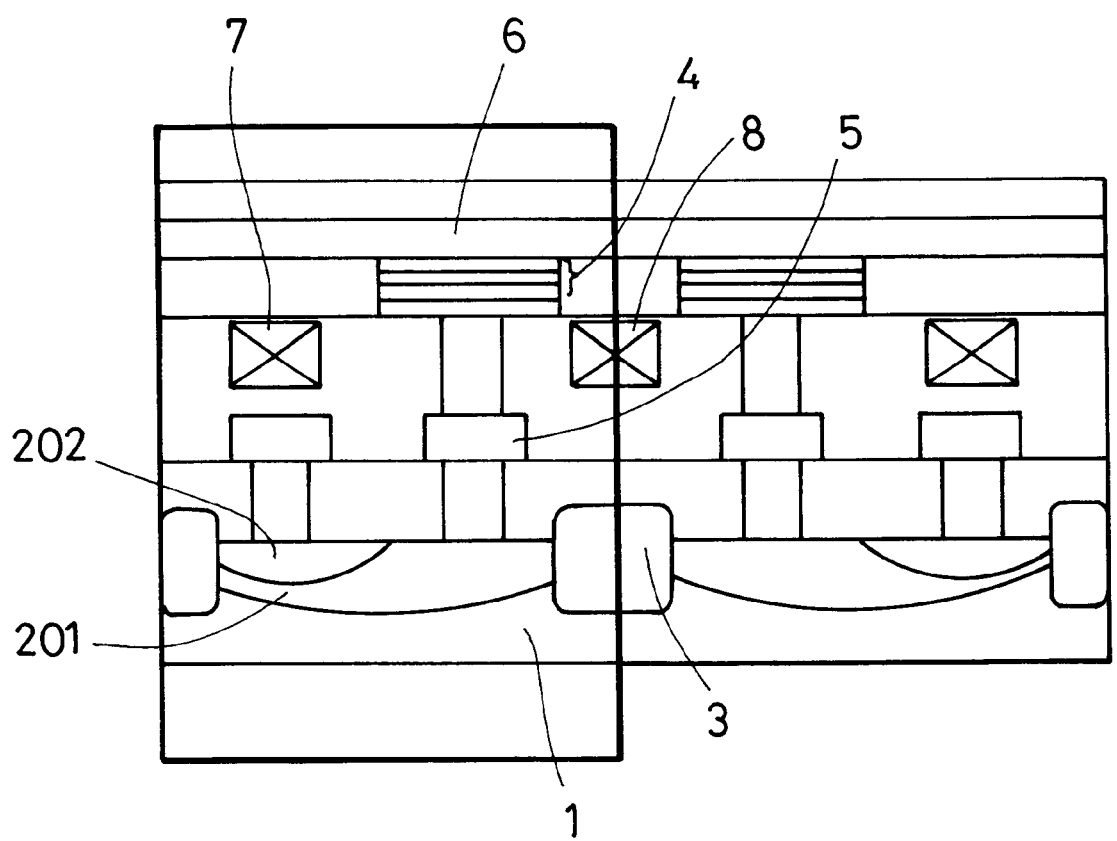
FIG. 8 is a sectional view showing another cell structure of the memory cells including the memory elements and field effect transistors shown in FIG. 5.

FIG. 8 is a sectional view showing another cell structure of the memory cell. In FIG. 8, the same elements are shown by the same numeral as those of the memory cell shown in FIG. 7. The memory cell shown in FIG. 8 differs from the memory cell shown in FIG. 7 in that a diode is used as the element-selecting device which acts as the switching element, and thus a simple matrix is provided. On a p-type silicon substrate 1, diffusion regions 201 and 202 for forming an anode and a cathode of the diode are formed. A write word line 8 shared by two memory element columns is placed above an element isolation region 3 which separates two diodes from each other. Consequently, the common line can be arranged at substantially the same distance from the two memory element columns, and the area occupied by one memory cell can be reduced in the same manner as the cell structure shown in FIG. 7.

Fifth Embodiment

Figure 9:
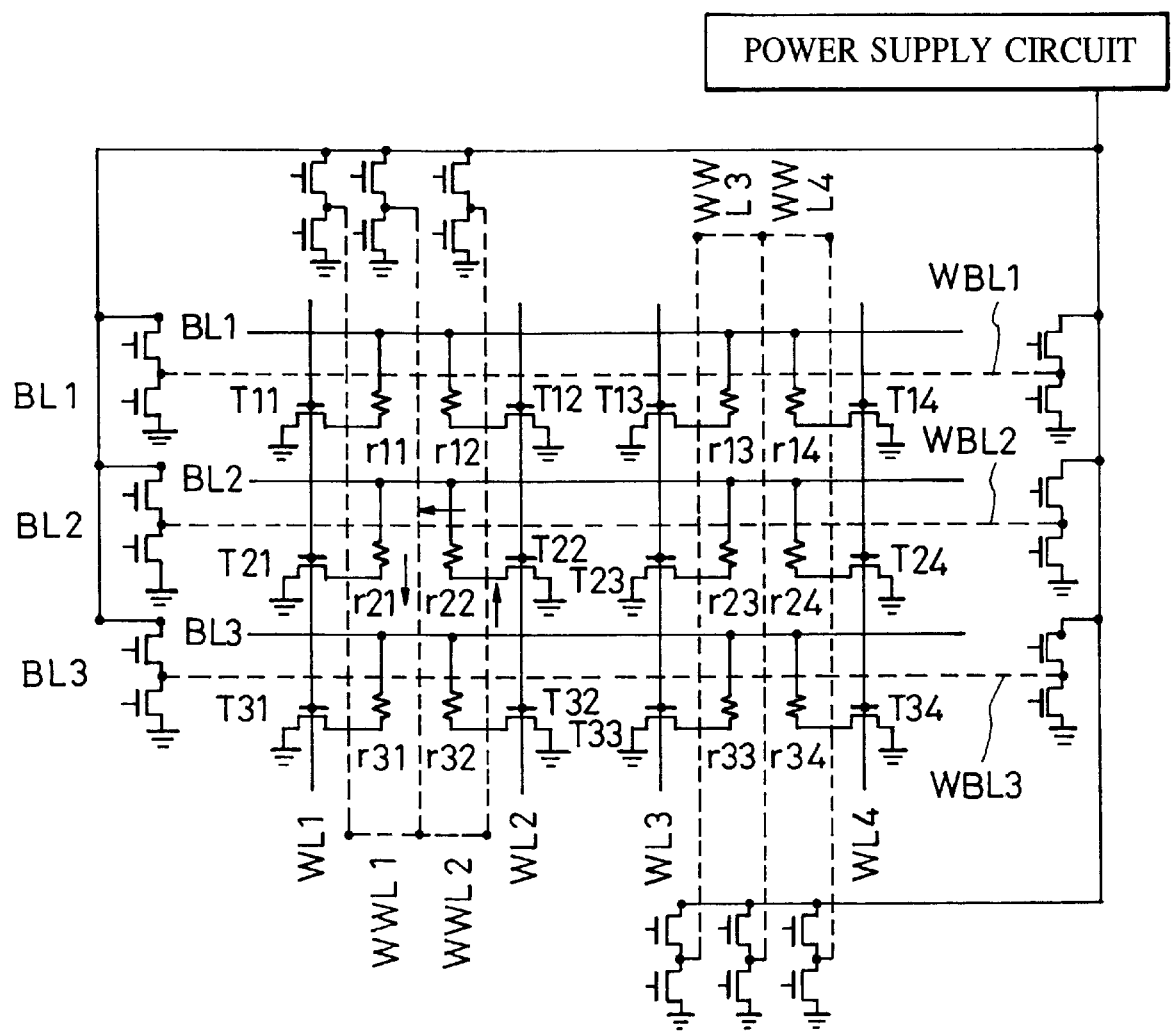
FIG. 9 is a circuit diagram showing a section mainly participating in writing of data in a magnetic memory in a fifth embodiment of the present invention.

FIG. 9 is a circuit diagram showing a section mainly participating in writing of data in a MRAM in a fifth embodiment of the present invention. In FIG. 9, the same elements of the MRAM are represented by the same numerals as those of the MRAM shown in FIG. 5.

In the fourth embodiment, the drive circuits for supplying currents to the write word lines are arranged at one end of the area in which the memory cell array is placed. In contrast, in the MRAM in this embodiment, as shown in FIG. 9, since drive circuits are arranged alternately at the opposite ends of the area in which the memory cell array is placed, when a relatively large write current is supplied from a power supply circuit through the drive circuits, it is easy to secure the areas necessary for the drive circuits, the area occupied by the peripheral circuits can be reduced, and uniform heat generation can be achieved.

Sixth Embodiment

Although the configurations in which the write bit lines and the read bit lines are independently provided are described in the first to fifth embodiments, write bit lines may be omitted and the read bit lines connected to the adjacent element row may also be used as the write bit lines.

Figure 10:
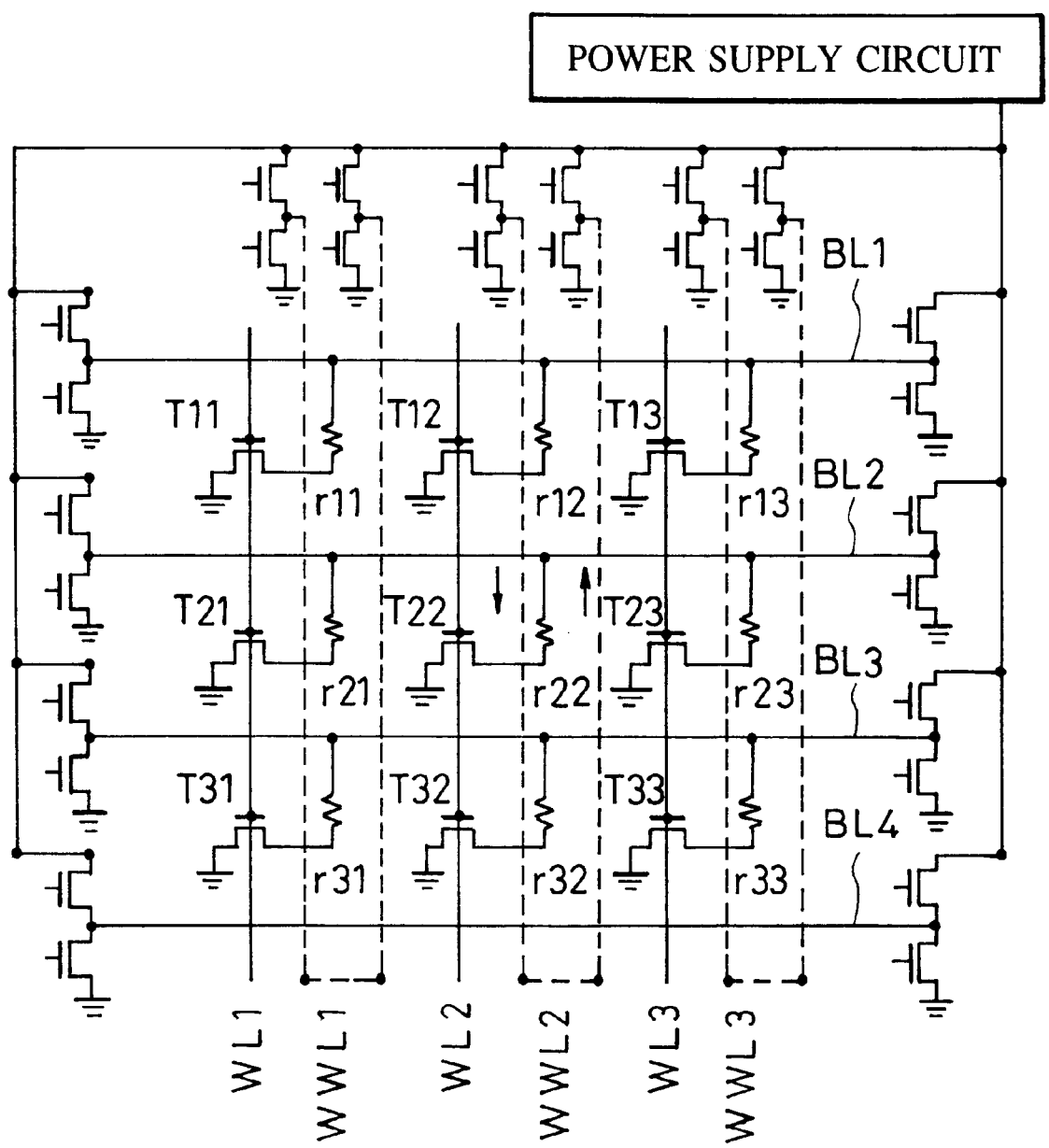
FIG. 10 is a circuit diagram showing a section mainly participating in writing of data in a magnetic memory in a sixth embodiment of the present invention.

FIG. 10 is a circuit diagram showing a section mainly participating in writing of data in a MRAM in a sixth embodiment of the present invention. In FIG. 10, the same elements of the MRAM are represented by the same numerals as those of the MRAM shown in FIG. 1.

As shown in FIG. 10, the MRAM includes a memory cell array in which memory cells are arrayed in a 3×3 matrix, and read bit lines also serve as write bit lines for the adjacent element rows. Specifically, a read bit line BL3 connected to the third memory element row including memory elements r31, r32, and r33 also serves as a write bit line for the second memory element row including memory elements r21, r22, and r23.

When data is written in the memory element r22, first, by passing a current through the write word line WWL2 sandwiching the second memory element column including the memory element r22, magnetic fields, perpendicular to the planes of the layers, are applied to the memory elements r12, r22, and r32 in the second column.

Next, a current is passed through the read bit line BL3 connected to the memory elements r31, r32, and r33 in the third row, which is adjacent to the second memory element row including the memory element r22.

Since the magnetic field generated by the current flowing through the read bit line BL3 is a perpendicular magnetic field for the memory element r22, both the perpendicular magnetic field generated from the write word line WWL2 and the perpendicular magnetic field generated from the read bit line BL3 are applied to the memory element r22. At this stage, if the directions of the two perpendicular magnetic fields are the same, a magnetic field sufficient for changing the magnetization direction of the memory layer of the memory element r22 can be applied.

As described above, in this embodiment, since the read bit lines for the adjacent memory element rows also serve as write bit lines, the number of write bit lines can be decreased, and the area occupied by the memory cell can be reduced.

Additionally, in this embodiment, although drive circuits for supplying currents to the write word lines are arranged at one end outside the memory cell array area, the drive circuits may be arranged alternately at the opposite ends outside the memory cell array area in the same manner as the embodiment shown in FIG. 3 or 9. Consequently, when a relatively large write current is supplied from the power supply circuit through the drive circuits, it is easy to secure the areas necessary for the drive circuits, the area occupied by the peripheral circuits can be reduced, and uniform heat generation can be achieved.

Seventh Embodiment

In the sixth embodiment, by applying a magnetic field perpendicular to the planes of the layers by the adjacent read bit line, writing is performed selectively in a predetermined memory element, while in this embodiment, read bit lines directly above the elements serve as write bit lines.

Figure 11:
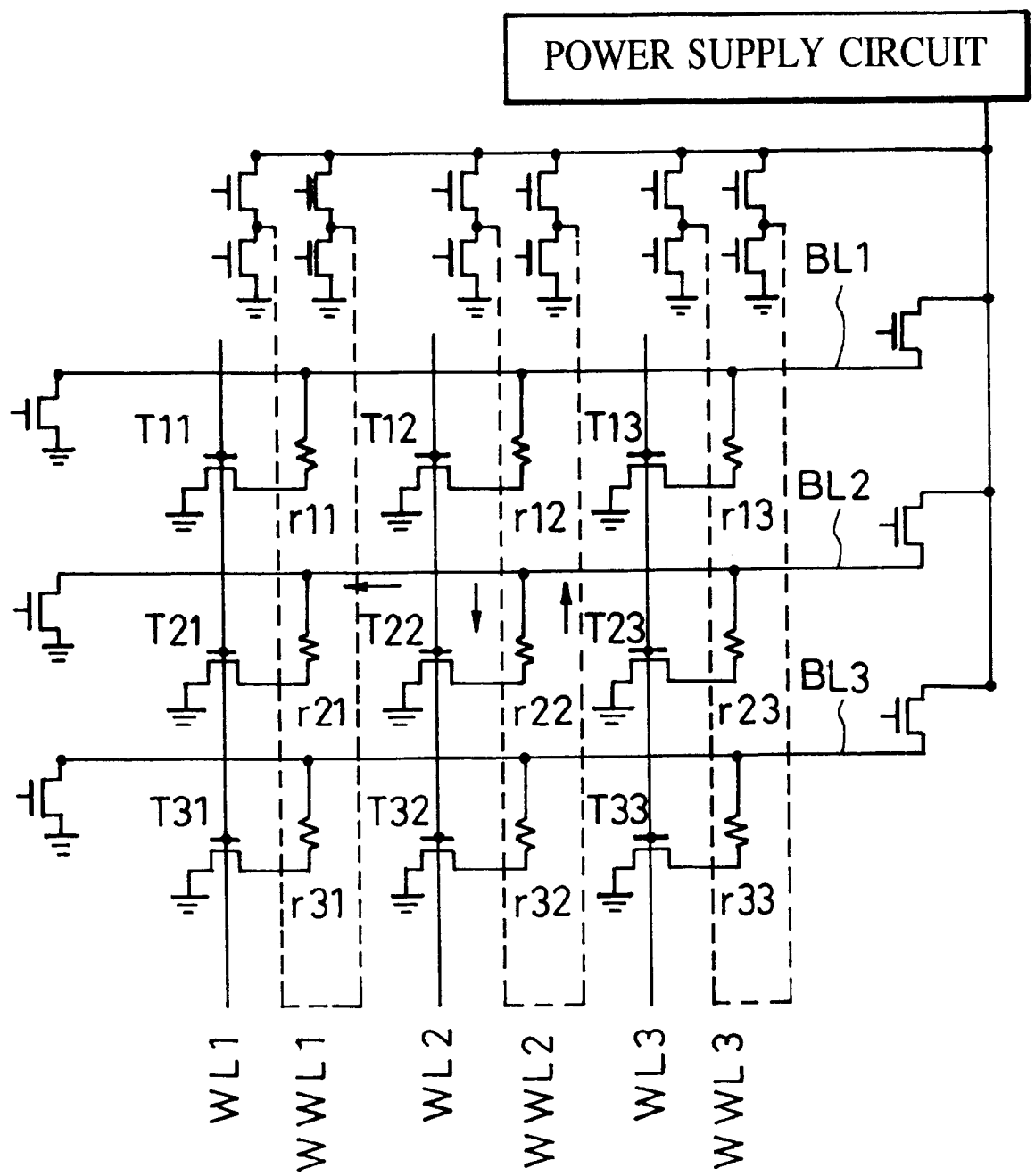
FIG. 11 is a circuit diagram showing a section mainly participating in writing of data in a magnetic memory in a seventh embodiment of the present invention.

FIG. 11 is a circuit diagram showing a section mainly participating in writing of data in MRAM in a seventh embodiment of the present invention. In FIG. 11, the same elements of the MRAM are represented by the same numerals as those of the MRAM shown in FIG. 1.

As shown in FIG. 11, the MRAM in this embodiment includes a memory cell array in which memory cells are arrayed in a 3×3 matrix, and read bit lines also serve as the corresponding write bit lines. Specifically, a read bit line BL2 connected to a second memory element row including memory elements r21, r22, and r23 also serves as a write bit line for the second memory element row.

When data is written in the memory element r22, first, by passing a current through the write word line WWL2 sandwiching the second memory element column including the memory element r22, magnetic fields, perpendicular to the planes of the layers, are applied to the memory elements r12, r22, and r32 constituting the second memory element column.

Next, a current is passed through the read bit line BL2 connected to the second memory element row including the memory element r22.

Since the read bit line BL2 is placed directly above the memory element r22 (refer to FIG. 2), the magnetic field generated by the read bit line BL2 is horizontal to the memory element r22, that is, in the in-plane direction. Therefore, the perpendicular magnetic field generated from the write word line WWL2 and the horizontal magnetic field generated from the read bit line BL2 are simultaneously applied to the memory element r22.

When the perpendicular magnetic field and the horizontal magnetic field are simultaneously applied to a magnetic layer having an easy magnetization axis directed perpendicular to the plane of the layer, the perpendicular magnetic field determines the magnetization direction of the magnetic layer, and the horizontal magnetic field assists in reducing the magnitude of the perpendicular magnetic field required for changing the magnetization direction, that is, the horizontal magnetic field functions as an assisting magnetic field. The assisting magnetic field may be directed in any direction as long as it is horizontally applied, regardless of the direction of the perpendicular magnetic field generated from the write word line WWL2.

Therefore, since the current can be passed through the read bit line BL2 in one way during writing, the drive circuits connected to the individual read bit lines may be simplified compared to the drive circuits connected to the individual write word lines as shown in FIG. 11.

As described above, since the horizontal magnetic field generated from the read bit line BL2 is simultaneously applied to the memory layer of the memory element r22 in addition to the perpendicular magnetic field generated from the write word line WWL1, the magnitude of the perpendicular magnetic field required for changing the magnetization direction of the memory layer of the memory element r22 is reduced by the horizontal magnetic field, and a magnetic field sufficient for changing the magnetization direction of the memory layer of the memory element r22 is applied.

As described above, in this embodiment, write bit lines can be eliminated, and furthermore, the configuration of the drive circuits for supplying write current to the read bit lines which also act as write bit lines can be simplified.

Although the drive circuits for supplying currents to the write word lines are arranged at one end of the area in which the memory cell array is placed in this embodiment, the drive circuits may be arranged alternately at the opposite ends outside the memory cell array area in the same manner as the embodiment shown in FIG. 3 or 9. Consequently, when a relatively large write current is supplied from the power supply circuit through the drive circuits, it is easy to secure the areas necessary for the drive circuits, the area occupied by the peripheral circuits can be reduced, and uniform heat generation can be achieved.

Figure 13:
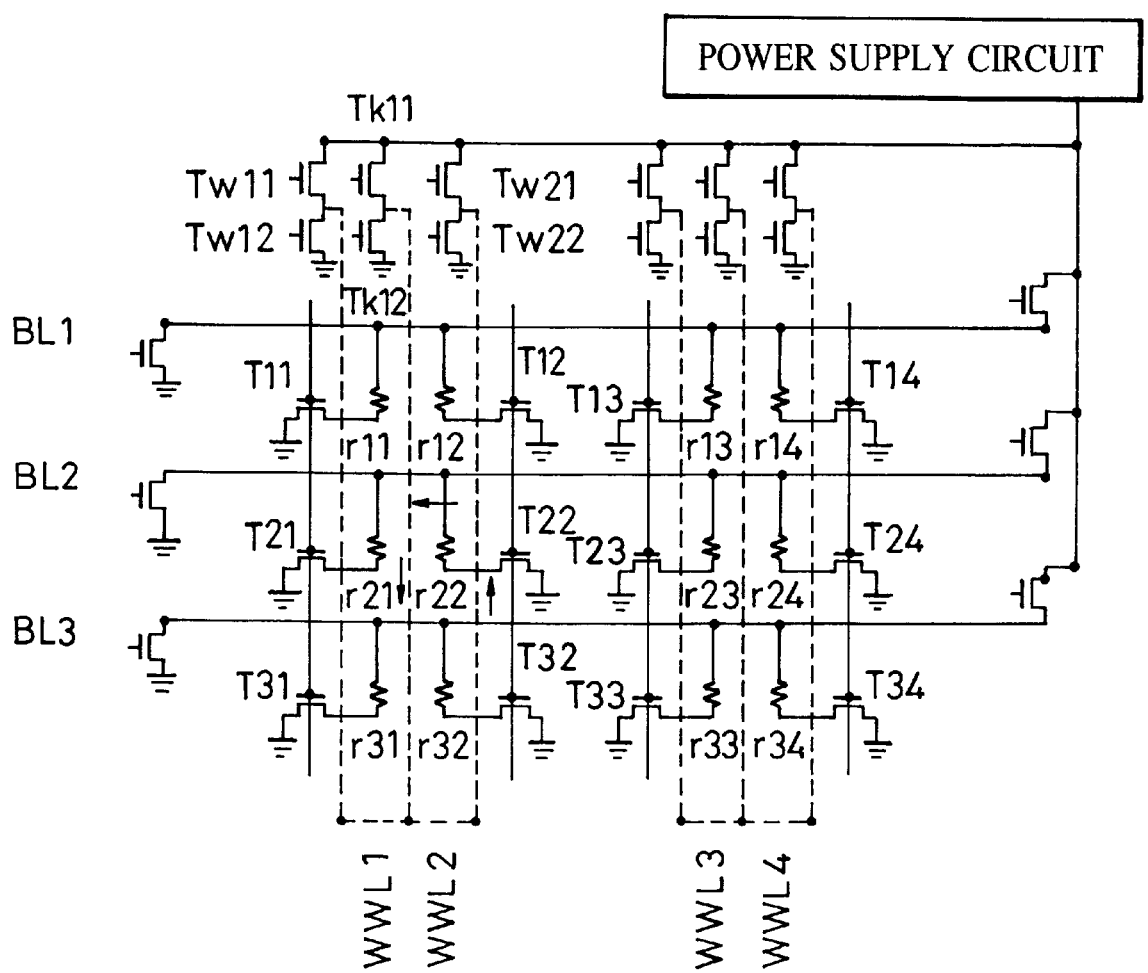
FIG. 13 is a circuit diagram showing a modified circuit configuration of the magnetic memory shown in FIG. 11.
Figure 14:
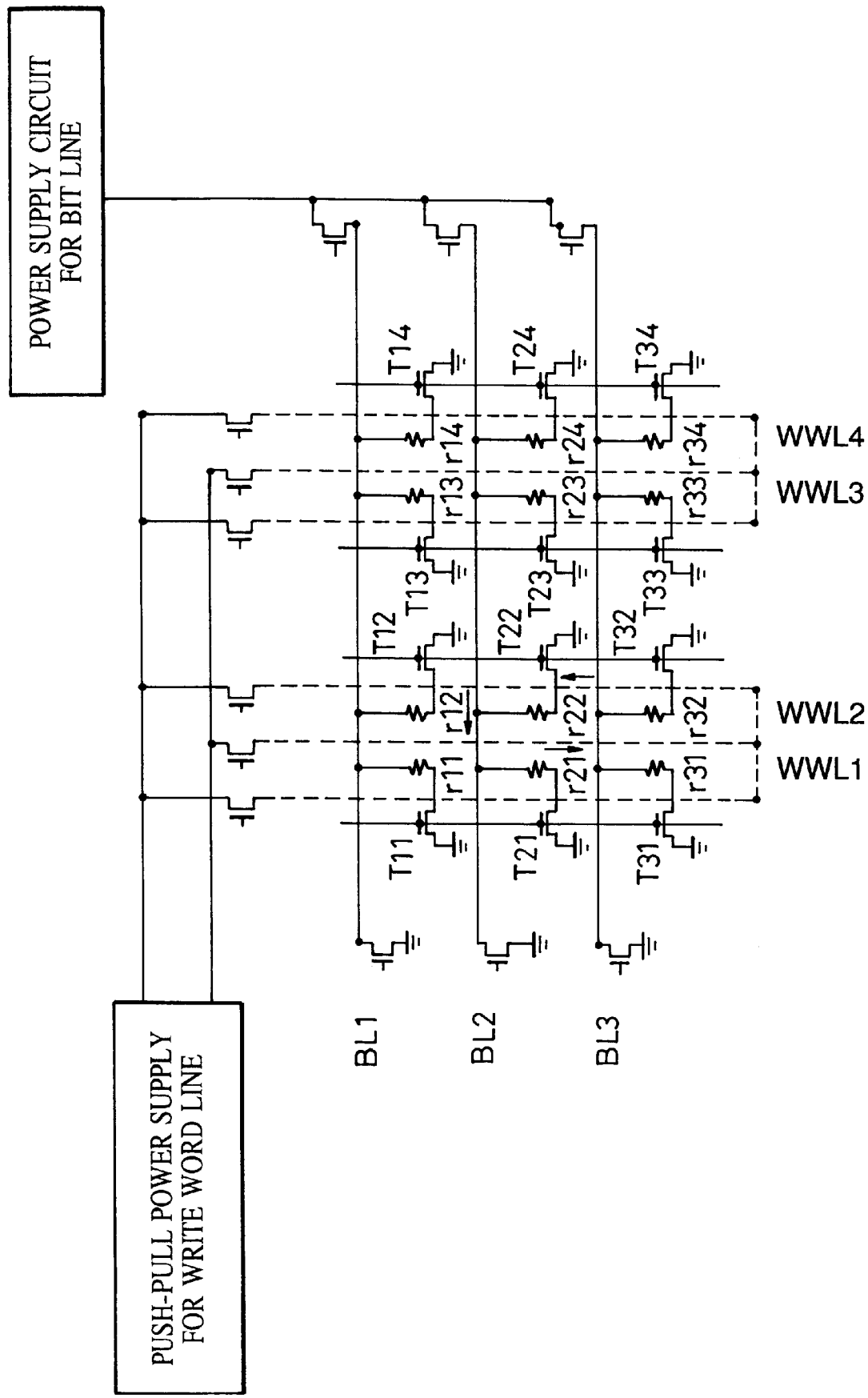
FIG. 14 is a circuit diagram showing another modified circuit configuration of the magnetic memory shown in FIG. 11.

Additionally, as described in the fourth embodiment, a configuration in which a write word line placed between two adjacent memory element columns may be shared by the memory element columns, thereby decreasing the number of write word lines (see FIG. 13), and a configuration using a push-pull power supply (see FIG. 14) may be employed.

Figure 15:
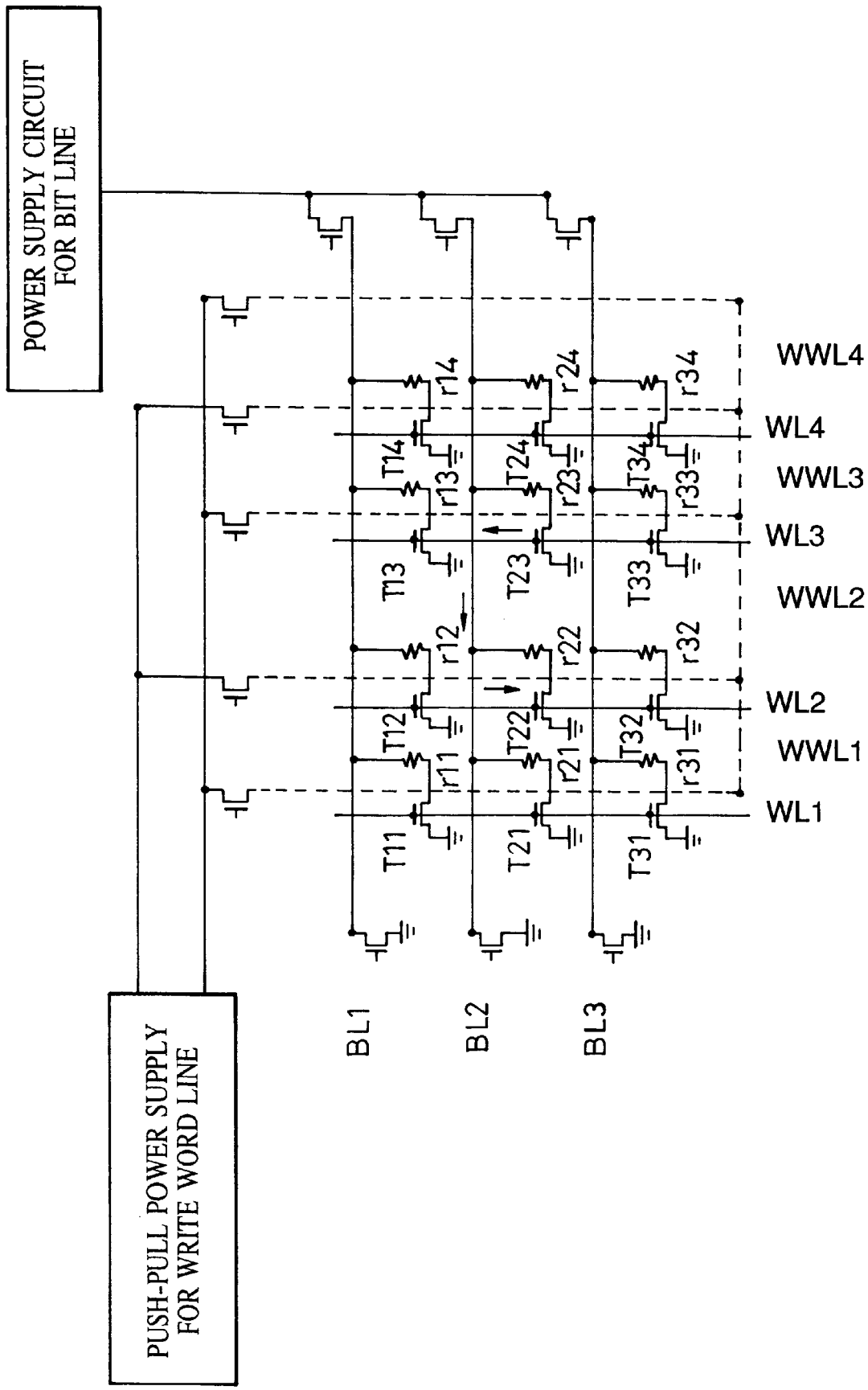
FIG. 15 is a circuit diagram showing another modified circuit configuration of the magnetic memory shown in FIG. 11.

Furthermore, as shown in FIG. 15, all of the write word lines sandwiched between the adjacent memory element columns may be shared by the memory element columns.

Eighth Embodiment

Figure 16:
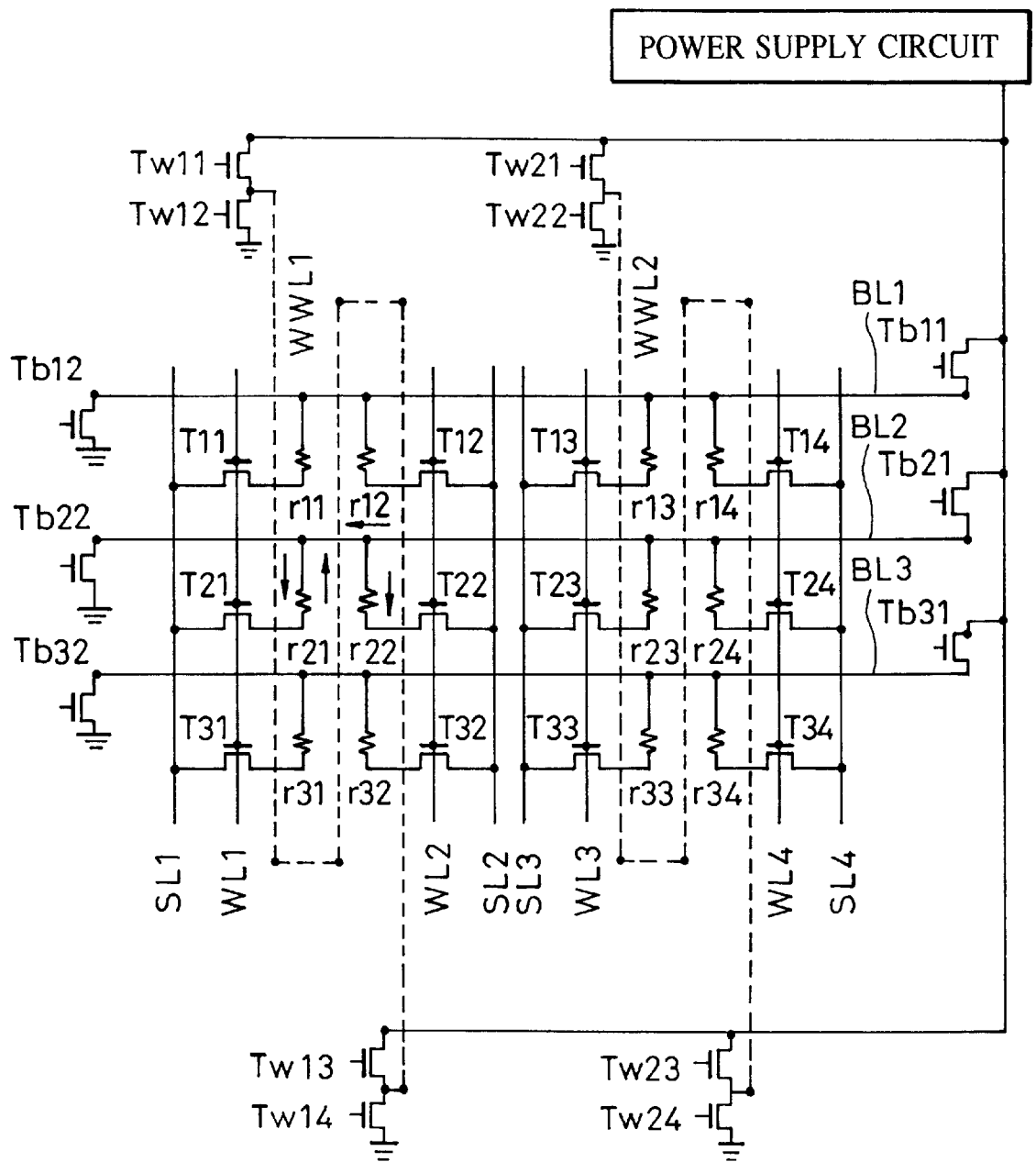
FIG. 16 is a circuit diagram showing a section mainly participating in writing of data in a magnetic memory in an eighth embodiment of the present invention.
Figure 17:
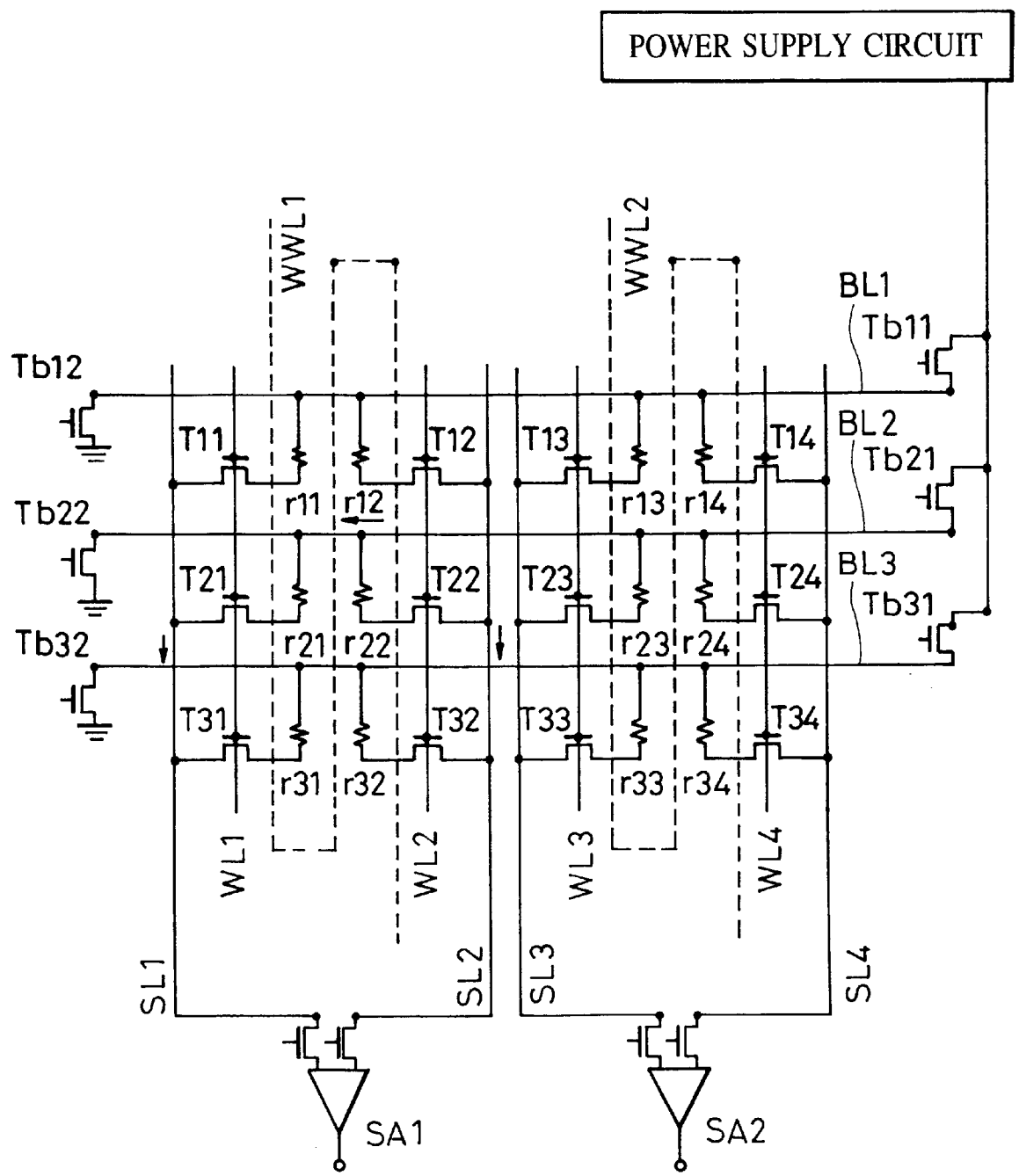
FIG. 17 is a circuit diagram showing a section mainly participating in reading of data in the magnetic memory in the eighth embodiment of the present invention.

FIG. 16 is a circuit diagram showing a section mainly participating in writing of data in a MRAM in an eighth embodiment of the present invention, and FIG. 17 is a circuit diagram showing a section mainly participating in reading of data in the MRAM. In the MRAM in this embodiment, two memory elements are complementarily operated to write one bit of data.

The configuration of the MRAM in this embodiment will be described with reference to FIGS. 16 and 17. The MRAM includes memory cells arrayed in a 3×4 matrix, each memory cell including an element-selecting device and a memory element; bit lines for both reading and writing; word lines for reading; sense lines SL1, SL2, and SL3 for reading; and write word lines WWL1 and WWL2. The bit lines may be provided separately for reading and writing.

FETs Tw11, Tw12, Tw13, Tw14, Tw21, Tw22, Tw23, and Tw24 function as switching elements, and when the FETs diagonally placed are simultaneously switched on, a current flows through the corresponding write word line. For example, when the FETs Tw11 and Tw14 are simultaneously switched on, a current flows through the write word line WWL1.

A sense amplifier SA1 is joined to the sense lines SL1 and SL2 in order to sense the current flowing through the memory elements r11, r21, r31, r12, r22, and r32 through the sense lines SL1 and SL2 during reading. Similarly, a sense amplifier SA2 is joined to the sense lines SL3 and SL4 in order to sense the current flowing through the memory elements r13, r23, r33, r14, r24, and r34 through the sense lines SL3 and SL4 during reading.

The operation of the MRAM having the configuration described above will be described below.

First, the writing operation in the memory elements in the memory cells will be described with reference to FIG. 16. Herein, writing of one bit of data in the memory elements r21 and r22 complementarily will be described. The data is written as magnetization directions of the memory layers which constitute the memory elements r21 and r22. In each memory element, preferably, the magnetic layer having a lower coercive force than the other magnetic layer is used as the memory layer because the magnitude of the write current required for writing can be decreased.

First, in the FETs connected to the write word line WWL1, the FETs Tw11 and Tw14 are switched on. Thereby, a current is supplied from the FET Tw11 to the FET Tw14 so as to flow round the first memory element column including the memory element r11, r21, and r31 and the second memory element column including the memory elements r12, r22, and r32.

At this stage, magnetic fields (from the back toward the front) are simultaneously applied to the memory elements r11, r21, and r31 constituting the first memory element column by the current flowing downward and upward shown in FIG. 16, and reverse magnetic fields (from the front toward the back) are simultaneously applied to the memory elements r12, r22, and r32 constituting the second memory element column by the current flowing upward and downward. Additionally, at this stage, magnetic fields of substantially the same magnitude are applied in opposite directions to the memory elements r11, r21, and r31 constituting the first memory element column and to the memory elements r12, r22, and r32 constituting the second memory element column.

Next, the FETs Tb21 and Tb22 connected to the bit line BL2 are switched on. Thereby, a current flows through the bit line BL2 from the FET Tb21 to the FET Tb22. Since the bit line BL2 is placed directly above the memory elements r21 and r22, the magnetic field generated by the current flowing through the bit line BL2 is directed horizontal to the memory elements r21 and r22.

Therefore, the magnetic field directed perpendicular to the planes of the layers generated by the current flowing through the write word line WWL1 and the horizontal magnetic field generated by the current flowing through the bit line BL2 are simultaneously applied to the memory elements r21 and r22.

When the perpendicular magnetic field and the horizontal magnetic field are simultaneously applied to a magnetic layer having an easy magnetization axis directed perpendicular to the plane of the layer, the perpendicular magnetic field determines the magnetization direction of the magnetic layer, and the horizontal magnetic field assists in reducing the magnitude of the perpendicular magnetic field required for changing the magnetization direction. The assisting magnetic field may be directed in any direction as long as it is horizontally applied, regardless of the direction of the perpendicular magnetic field generated by the current flowing through the write word line WWL1.

Therefore, since the current can be passed through each bit line in one direction instead of in two directions during writing, the drive circuit connected to each bit line may be simplified compared to the drive circuit connected to each write word line as shown in FIG. 16.

The horizontal magnetic field generated from the bit line BL2 together with the perpendicular magnetic field generated from the write word line WWL1 is applied to the memory elements r21 and r22. Thereby, magnetizations of the memory layers of the memory elements r21 and r22 change in the direction of the perpendicular magnetic field generated from the write word line WWL1, and the data is written.

At this stage, since the perpendicular magnetic field generated from the write word line WWL1 is applied to the memory elements r21 and r22 in opposite directions, the memory layers of the memory elements r21 and r22 are magnetized in opposite directions. That is, the memory cells provided with the memory elements r21 and r22 are complementarily operated, and one bit of data is written by two memory cells (memory elements r21 and r22).

Next, the reading operation of the data written as the magnetization directions in the memory elements r21 and r22 will be described with reference to FIG. 17.

First, by switching on the FET Tb21 connected to the bit line BL2 and by switching off the FET Tb22, a voltage is applied to the bit line BL2.

Next, by applying voltages to the lines WL1 and WL2, the FETs T21 and T22 are switched on.

Herein, since the memory elements r21 and r22 complementarily operate, when the magnetization directions are parallel in one memory element, the magnetization directions are antiparallel in the other memory element.

Therefore, since the memory elements r21 and r22 have different resistances, the values of currents flowing therethrough are different. By sensing the difference in the current values through the sense lines SL1 and SL2 by the sense amplifier SA1, data stored in the memory elements r21 and r22 is identified. For example, when the memory element r21 has a high resistance and the memory element r22 has a low resistance, a "1" is considered to be stored, and when the resistance state is converse, a "0" is considered to be stored.

Although the write word lines are placed parallel to the memory element columns in which the memory elements are arranged and currents are passed through the write word lines so as to sandwich the memory element columns in this embodiment, the write word lines may be placed parallel to the memory element rows in which the memory elements are arranged and currents may be passed through the write word lines so as to sandwich the memory element rows.

Next, the cell structure of the memory cell will be described in detail.

Figure 18:
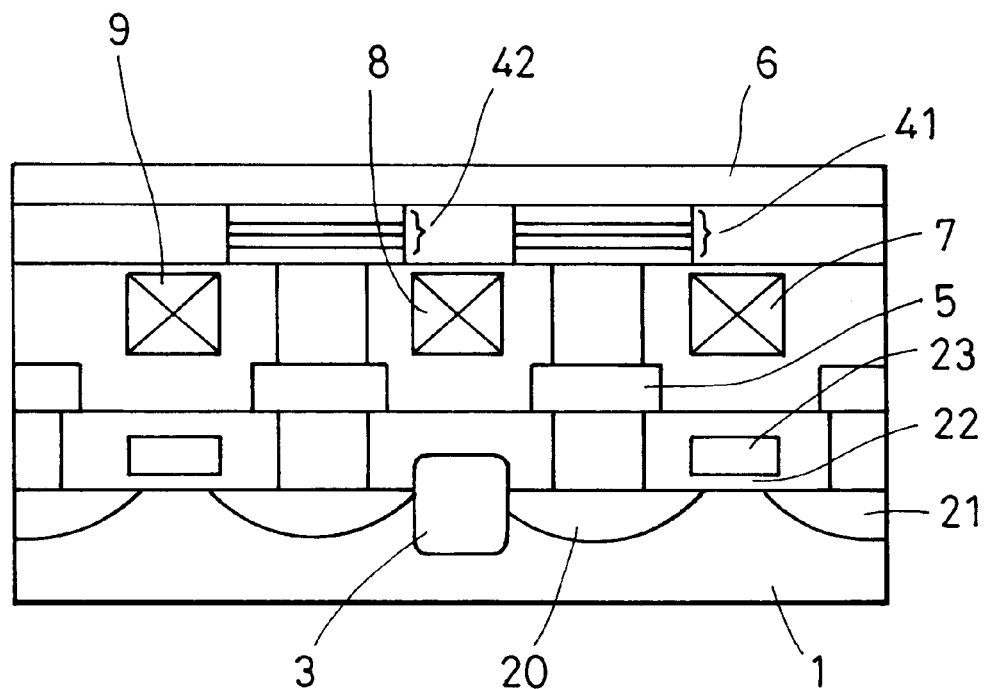
FIG. 18 is a sectional view of a cell structure of the memory cells including the memory elements and field effect transistors shown in FIG. 16.

FIG. 18 is a sectional view showing a cell structure of the memory cells including the memory elements and the FETs shown in FIG. 16. As shown in FIG. 18, memory cells constituting one bit in this example include two memory elements 41 and 42, two FETs acting as the switching elements, and three write word lines 7, 8, and 9. However, the write word lines 7, 8, and 9 are connected to each other so that a continuous current passed through.

On a p-type silicon substrate 1, an embedded element isolation region 3 composed of $SiO_2$, n-type diffusion regions 20 and 21 for forming a source and a drain of the FET, a gate insulating film 22 composed of $SiO_2$, and a gate electrode 23 composed of polysilicon are formed.

In each of the memory elements 41 and 42, an aluminum oxide layer with a thickness of approximately 1 nm is sandwiched by two ferrimagnetic layers having easy magnetization axes directed perpendicular to the planes of the films, the ferrimagnetic layers being a GdFe layer and a TbFe layer. One of the ferrimagnetic layers is connected to the n-type diffusion region 20 through a local line 5 composed of TiN, and the other ferrimagnetic layer is connected to a bit line 6 composed of Ti/AlSiCu/Ti.

The write word lines 7, 8, and 9 are placed so as to sandwich the memory elements 41 and 42 at the p-type silicon substrate 1 side, and the write word lines 7, 8, and 9 are connected to each other at the ends so that a continuous current is passed through.

In particular, the write word line 8, which is a common line shared by the memory elements 41 and 42, is arranged above the element isolation region 3 for isolating the two FETs from each other. Thereby, the common line can be placed at substantially the same distance from the two memory elements 41 and 42.

For example, the current flows through the write word lines 7 and 9 from the back to the front, and the current flows through the write word line 8 from the front to the back. Thereby, a combined magnetic field of the magnetic fields generated from the write word lines 7 and 8 is applied downward to the memory element 41, and a combined magnetic field of the magnetic fields generated from the write word lines 8 and 9 is applied upward to the memory element 42.

That is, by passing the continuous write current to the write word lines 7, 8, and 9, magnetic fields in opposite directions are applied to the memory elements 41 and 42, each magnetic field being a combined magnetic field induced by the two write word lines sandwiching each memory element.

Since the bit line 6 is placed directly above the memory elements 41 and 42, the magnetic fields generated by the current flowing through the bit line 6 are horizontal to the memory elements 41 and 42. The horizontal magnetic fields, together with the perpendicular magnetic fields generated from the write word lines 7, 8, and 9, are applied to the memory elements 41 and 42, and assist in reducing the magnitude of the perpendicular magnetic fields required for changing the magnetization directions. Thereby, the memory layers of the memory elements 41 and 42 can be easily magnetized in opposite directions, and the memory elements 41 and 42 are complimentarily operated so that one bit of data can be written by two memory cells.

Additionally, since the write word lines 7, 8, and 9 are placed on the same plane, it is possible to form the write word lines and the joints thereof by one process, by only changing a mask pattern. Therefore, no new fabrication processes are required, which is advantageous. As described above, the parasitic capacitance can also be easily controlled.

Figure 19:
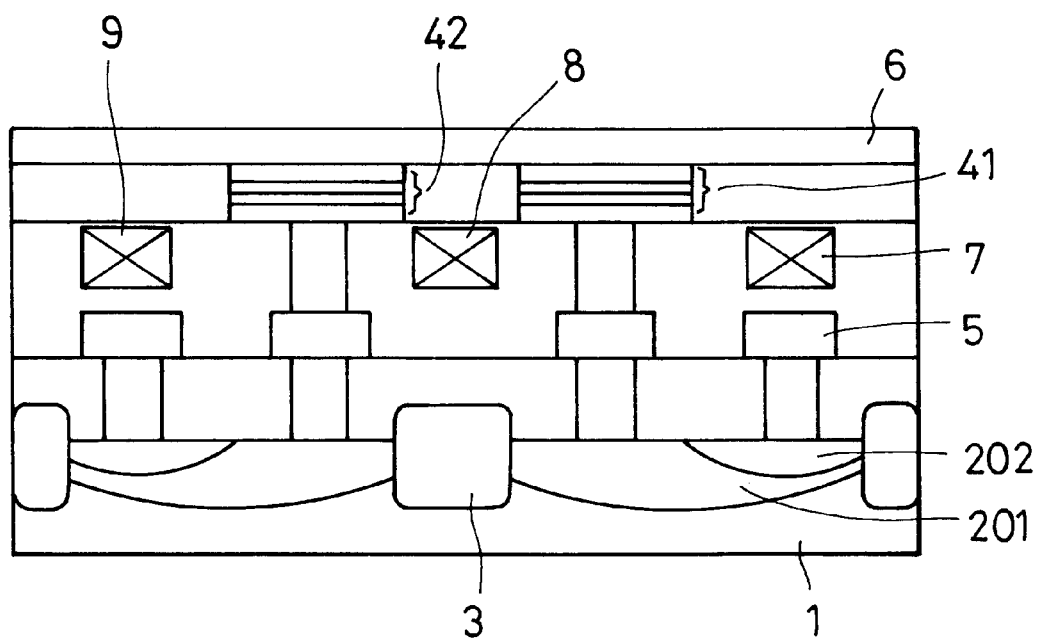
FIG. 19 is a sectional view of another cell structure of the memory cells including the memory elements and field effect transistors shown in FIG. 16.

FIG. 19 is a sectional view of another cell structure of the memory cells including the memory elements and the FETs shown in FIG. 16. In FIG. 19, the same elements of the memory cells are represented by the same numerals as those of the memory cells shown in FIG. 18. The memory cells shown in FIG. 19 differ from the memory cells shown in FIG. 18 in that diodes are used as the element-selecting devices which act as the switching elements, and thus a simple matrix is provided.

On a p-type silicon substrate 1, diffusion regions 201 and 202 for forming an anode and a cathode of the diode are formed.

A write word line 8, which is a common line shared by the memory elements 41 and 42, is placed above an element isolation region 3 which isolates two diodes from each other. Consequently, the common line can be arranged at substantially the same distance from the two memory elements 41 and 42.

Ninth Embodiment

In the eighth embodiment described above, by connecting four FETs to each write word line, the write current can be supplied reversibly, and by connecting two FETs to each bit line, the write current can be supplied in a predetermined direction. However, as a power supply circuit for supplying a common write current reversibly, a push-pull power supply may be used.

Figure 20A:
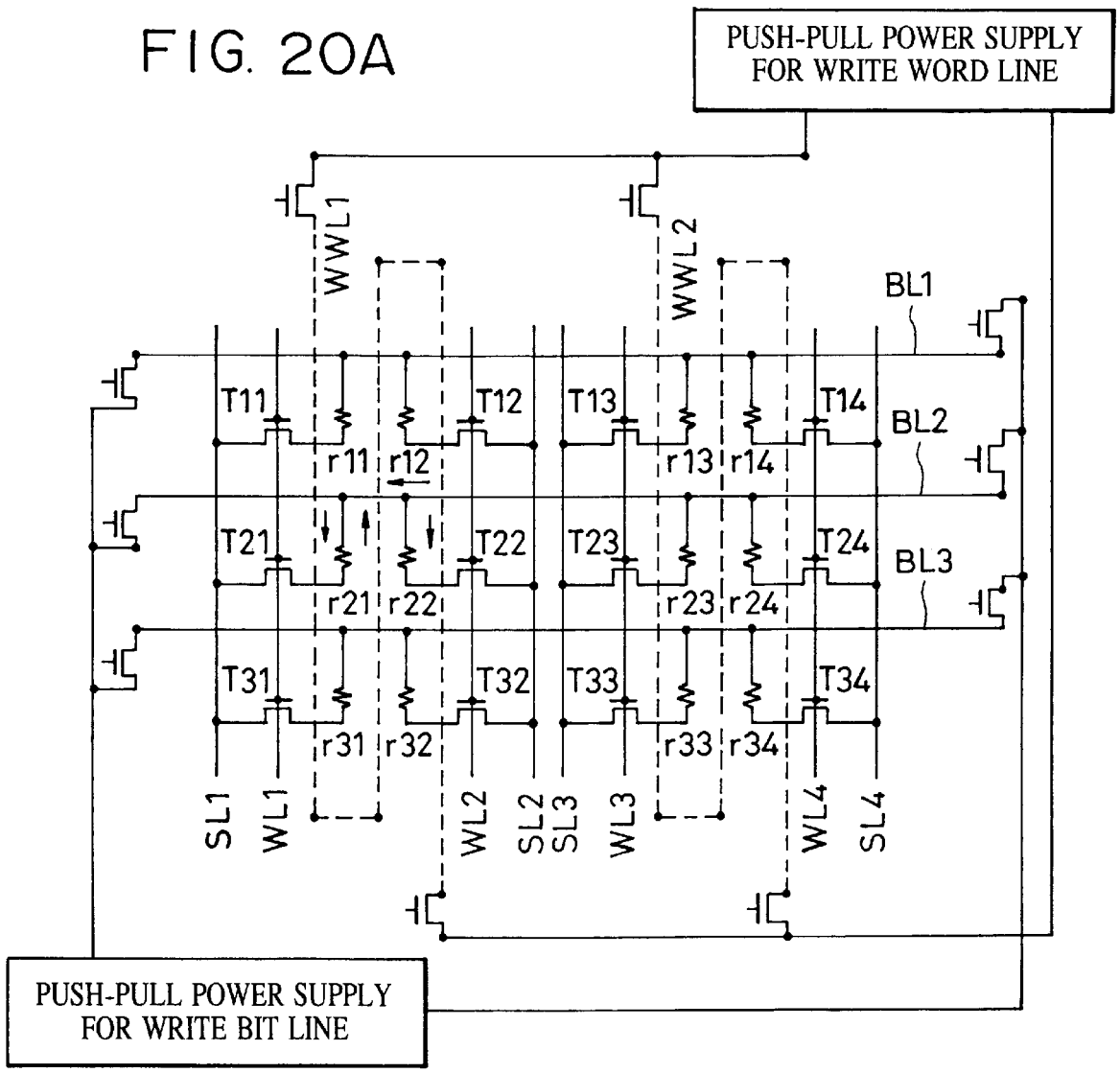
FIG. 20A is a circuit diagram showing a section mainly participating in writing of data in a magnetic memory in a ninth embodiment of the present invention.
Figure 20B:
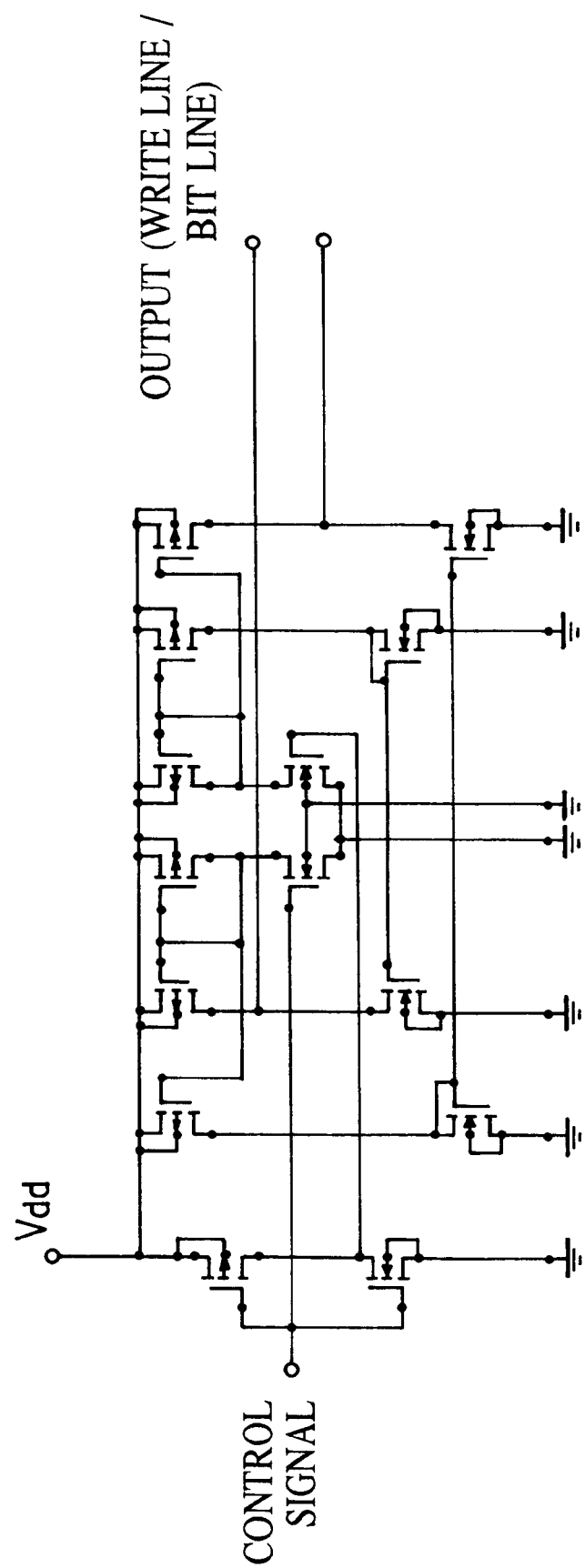
FIG. 20B is a circuit diagram showing a push-pull power supply in the magnetic memory shown in FIG. 20A.

FIG. 20A is a circuit diagram showing a section mainly participating in writing of data in a MRAM in this embodiment. In FIG. 20A, the same elements are represented by the same numerals as those of the MRAM shown in FIG. 19.

As described above, in the eighth and ninth embodiments, two magnetoresistive elements sandwiching a write word line are magnetized in opposite directions, and the two magnetoresistive elements can be operated complementarily. Therefore, the difference in the values of currents flowing through the two magnetoresistive elements can be easily sensed by a sense amplifier, and thereby, the sensitivity for the magnetization directions of the memory layers of the magnetoresistive elements can be improved, and also the magnetization directions of the memory layers can be easily sensed.

Accordingly, even when the magnetoresistivity of the magnetoresistive element is low, writing and reading of data can be performed stably.

Tenth Embodiment

In this embodiment, in a configuration in which a pair of memory elements operate complementarily, data are read from and written in a plurality of pairs of memory elements in parallel. In order to operate a memory at high speeds, parallel driving is preferably performed in which a plurality of data are simultaneously read and written. In a MRAM, when writing is performed, a current is supplied to a write word line in one direction, and the same data (for example, "1") is written in a plurality of selected pairs of magnetoresistive elements, and then, a write current is supplied in the opposite direction, and the opposite data (for example, "0") is written in the remaining pairs of magnetoresistive elements. Alternatively, a current is supplied to a write word line in one direction and the same data (for example, "0") is written in a plurality of pairs of magnetoresistive elements, followed by resetting, and then, a write current is supplied in the opposite direction, and the opposite data (for example, "1") is written in the selected pair of magnetoresistive elements, and thereby parallel writing is performed. However, in a configuration in which a sensing amplifier is shared by a plurality of element pair columns, it is not possible to simultaneously read the plurality of element pair columns which share write word lines. In this embodiment, even in a configuration in which one bit is written by operating two memory elements complementarily, parallel reading and writing are enabled.

Figure 21:
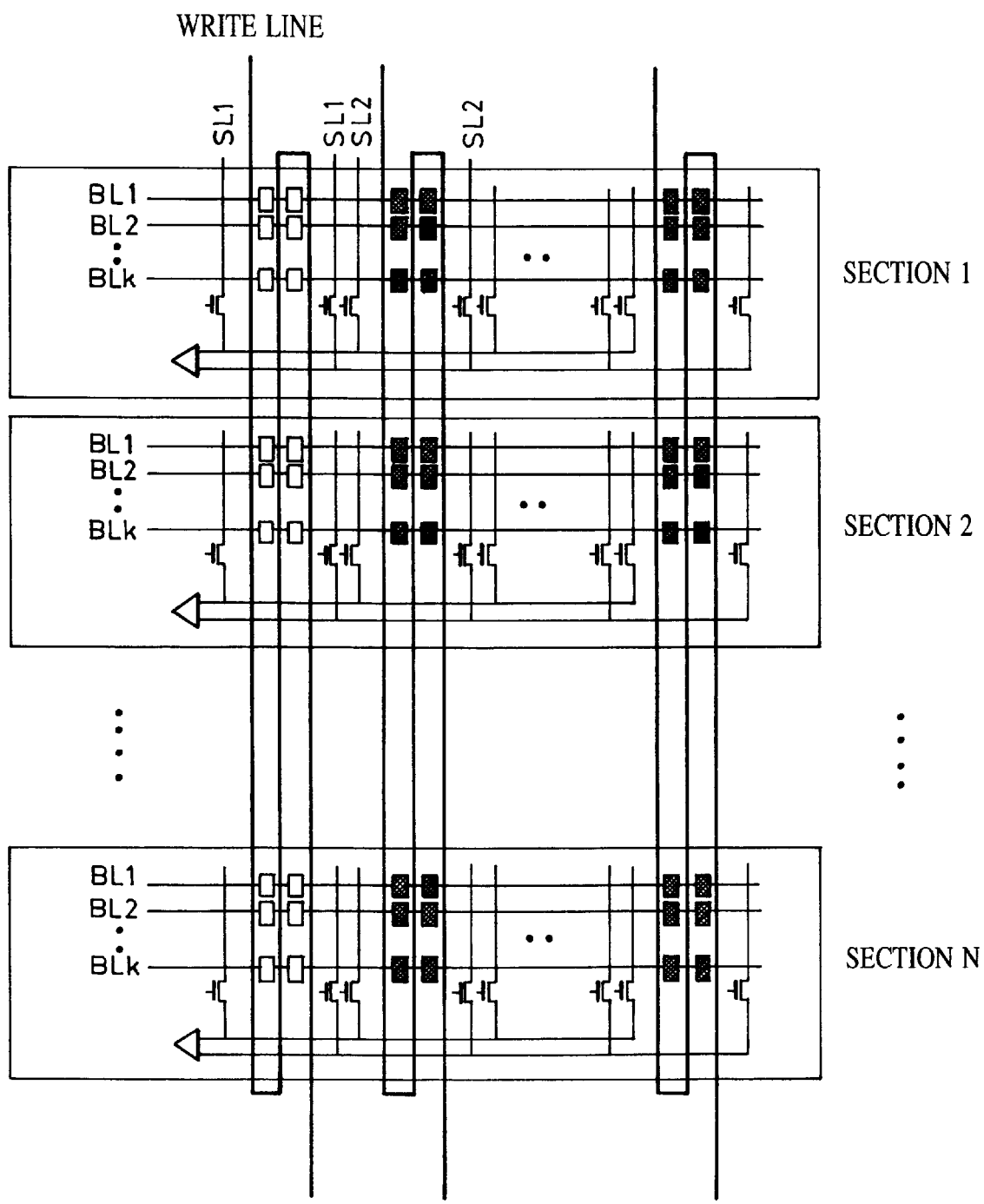
FIG. 21 is a schematic diagram showing a magnetic memory in a tenth embodiment of the present invention, in which write lines extend over a plurality of memory sections.

FIG. 21 is a schematic diagram showing a MRAM in a tenth embodiment of the present invention. In this embodiment, write word lines which sandwich each of two memory element columns and which are placed in parallel are connected to each other at the ends so that a current flows therethrough continuously. Predetermined numbers of elements belong to each of a plurality of memory sections. In each memory section, a sense amplifier is shared for sensing the resistance of the memory elements.

In such a configuration, driving of a pair of memory elements sharing a common write word line is performed simultaneously in plural memory sections, and thereby a plurality of data are simultaneously written, and also output is performed simultaneously.

Figure 22:
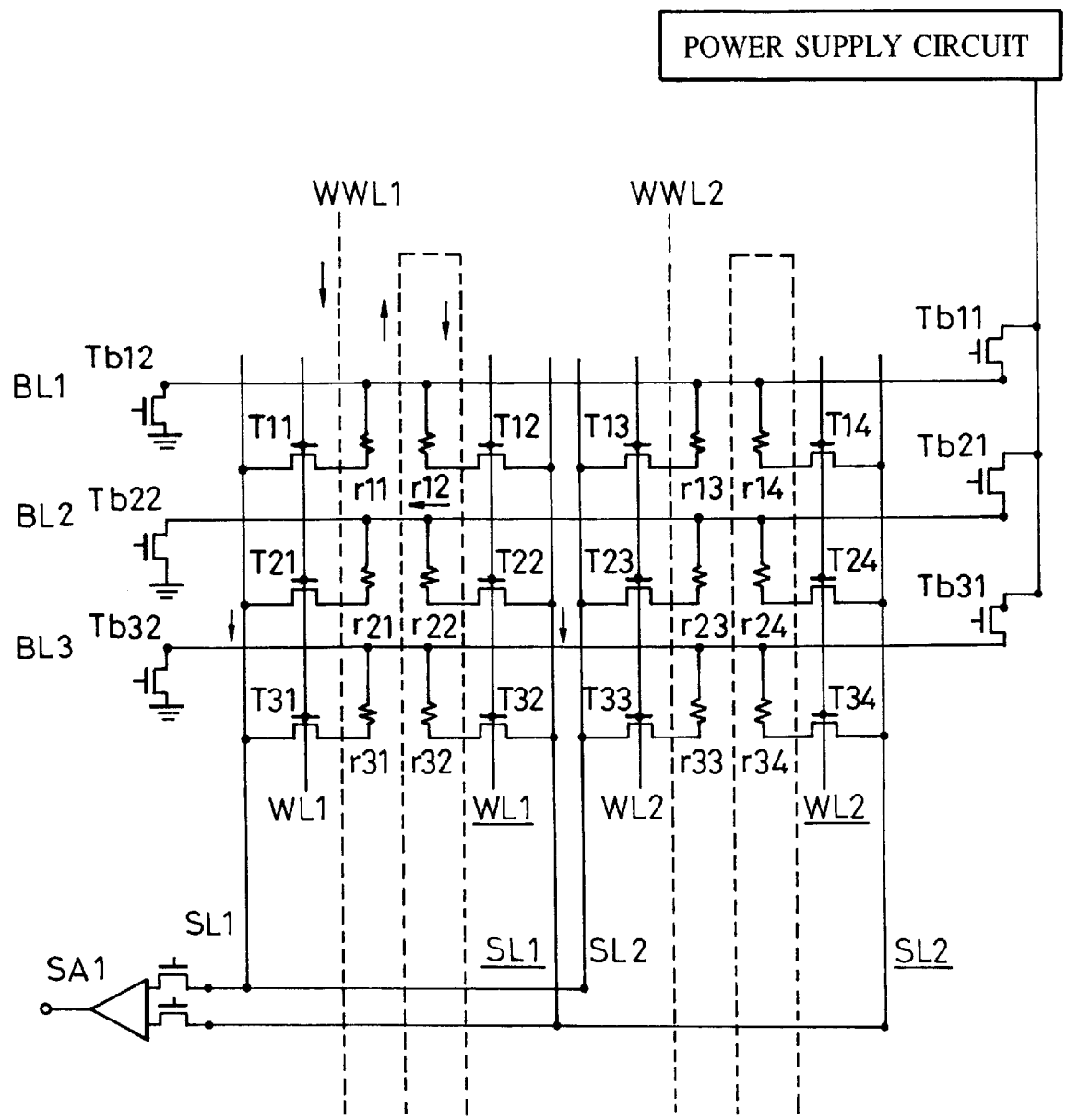
FIG. 22 is a circuit diagram showing a memory section in the magnetic memory shown in FIG. 21.

FIG. 22 is a circuit diagram showing the configuration of one memory section, including a plurality of bit lines and write word lines, each bit line being connected to two pairs of memory cells which operate complementarily.

Although the operation of one section constituting the memory is the same as the eighth embodiment, by operating the memory elements placed in the same position of a plurality of sections sharing the write lines in the same manner, a plurality of data can be simultaneously written or read. That is, since parallel driving can be performed, the read/write speed can be greatly increased, and since the current passed through the write line can be shared, power consumption during writing can be greatly reduced.

Eleventh Embodiment

Figure 24:
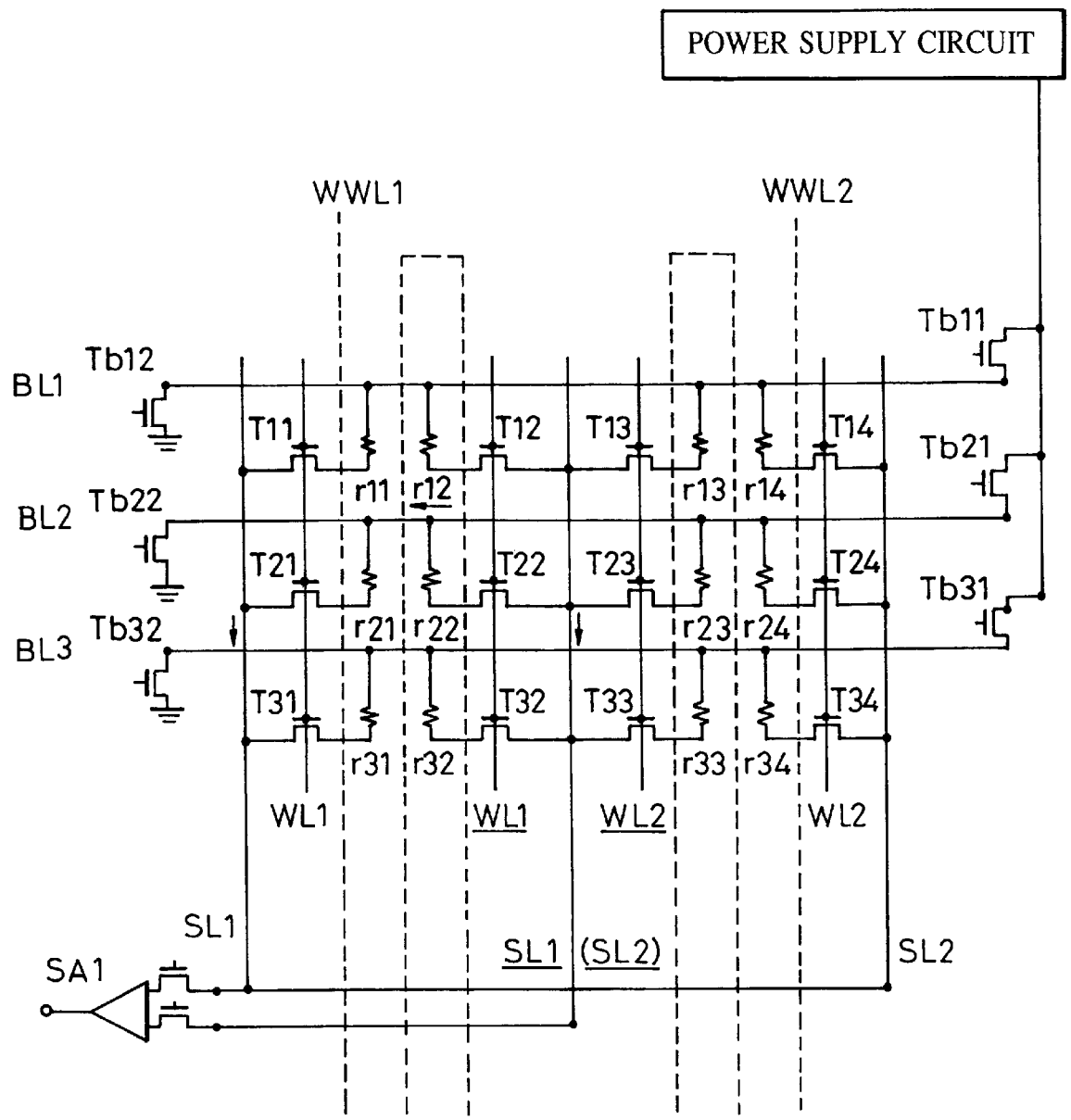
FIG. 24 is a circuit diagram showing a memory section in a magnetic memory in an eleventh embodiment of the present invention.

FIG. 24 is a circuit diagram showing a memory section in a magnetic memory in an eleventh embodiment of the present invention. The same elements are represented by the same numerals as those in the memory section shown in FIG. 22. As shown in FIG. 24, one section includes 3×4 memory cells. A plurality of bit lines share write lines, and two pairs of memory cells operating complementarily are connected to each bit lines. The memory section shown in FIG. 24 differs from the memory section shown in FIG. 22 in that the sense line SL1 is also used as the sense line SL2, and the write word lines WWL1 and WWL2 are symmetrically placed with respect to the sense line SL1 (SL2). In such a configuration, the number of sense lines can be reduced for two pairs of memory cells compared to the configuration shown in FIG. 22. Therefore, if N pairs of memory cells are connected to one bit line, the necessary number of sense lines is N+1, and thereby, higher integration can be performed.

Figure 23:
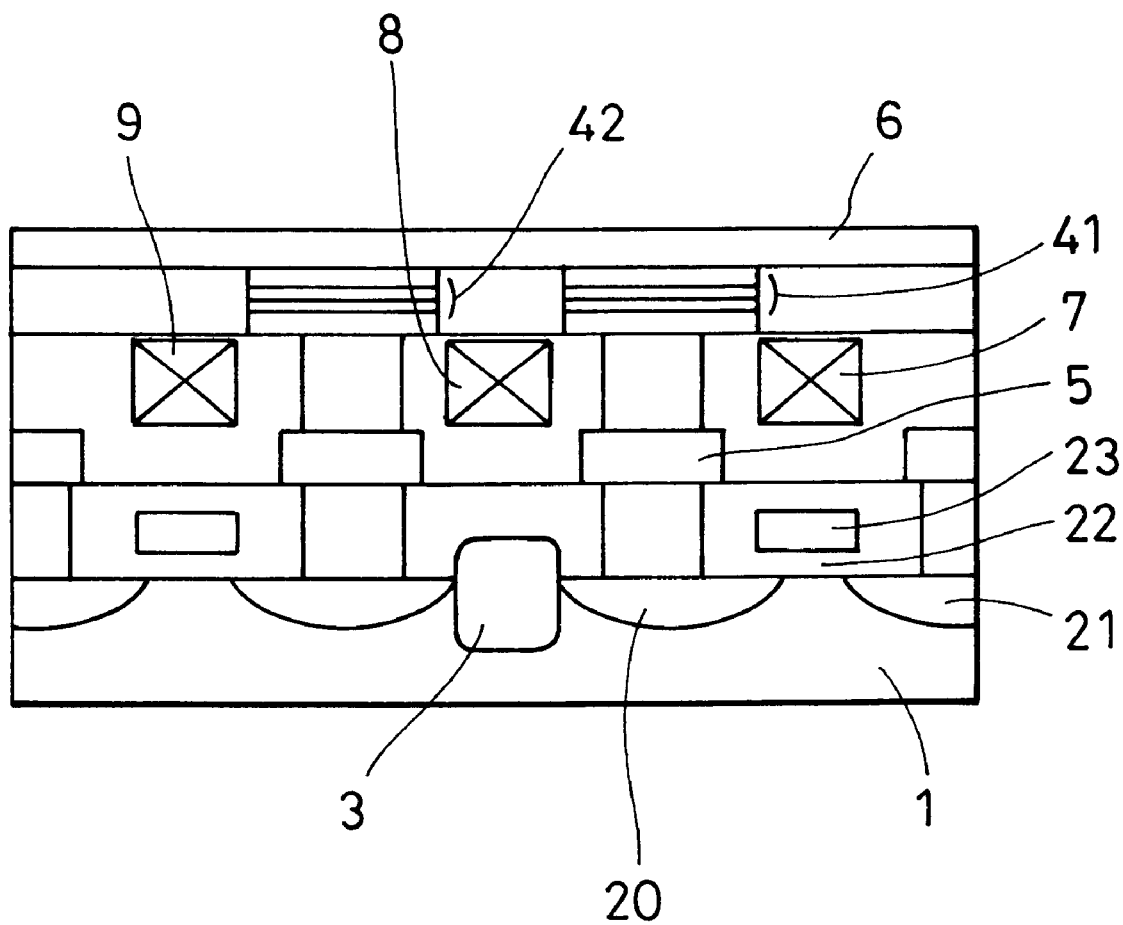
FIG. 23 is a sectional view showing a pair of memory cells in the memory section shown in FIG. 22.
Figure 25:
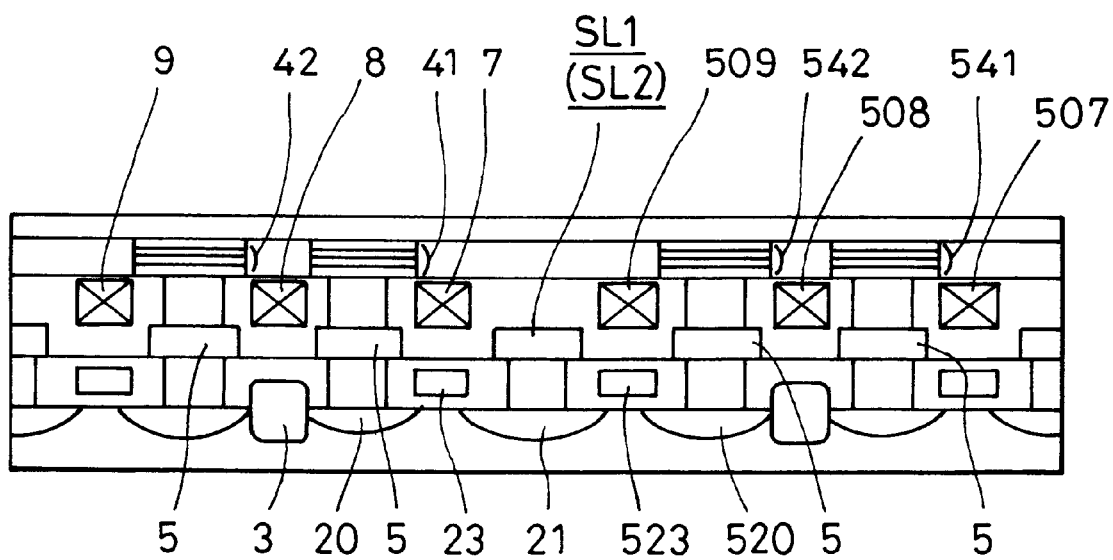
FIG. 25 is a sectional view which schematically shows two pairs of memory cells in the magnetic memory shown in FIG. 24.

FIG. 25 is a sectional view which schematically shows two pairs of memory cells in the magnetic memory shown in FIG. 24. The same elements are represented by the same numerals as those in the memory cells shown in FIG. 23. Although memory elements 41 and 542 placed in the center of the drawing do not share a write line, FETs connected to the memory elements 41 and 542 share a source region 21, and furthermore, the sense line SL1 (SL2) connected to the source region 21 is shared by the memory cells. Thereby, the number of sense lines is decreased and the necessary area for the FETs as selecting elements is reduced, and therefore, a highly integrated MRAM can be obtained.

The MRAM of the present invention is not limited to the embodiments described above, and the configurations in the embodiments may be appropriately combined.

Since the MRAMs of the present invention are high-speed rewritable nonvolatile memories, they are suitable for use as work memories (internal memories) for portable communication apparatuses, personal computers, etc. By using the MRAM of the present invention as a work memory, it is possible to suspend and resume processing immediately without using a backup power supply or a cache memory or buffer memory, and thereby, miniaturization of apparatus and cost reduction can be achieved.

In the MRAM of the present invention, the rewriting speed can be increased by several orders of magnitude compared to the NOR flash memory which is used as a program memory in portable information processors, such as portable communication apparatuses and portable personal computers. Therefore, if the MRAM of the present invention is used for portable information processors, performance can be greatly improved.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid-state magnetic memory comprising:
   a substrate;
   a plurality of memory cells arrayed in a matrix on the substrate, each memory cell comprising a memory element and an element-selecting device, the memory element comprising two magnetic layers and a non-magnetic layer sandwiched between the magnetic layers, the easy magnetization axis of each magnetic layer being directed perpendicular to the plane of the layer;
   a plurality of bit lines connected to the memory elements for reading out data recorded in the memory elements; and
   a plurality of write lines placed substantially in the same plane, at least one end of each write line being joined to one end of another write line so that a current flows in opposite directions at both sides of the memory cell column.

2. A solid-state magnetic memory according to claim 1, further comprising drive circuits connected to the other ends of the write lines, the driving circuits being provided at both sides of the memory cell array.

3. A solid-state magnetic memory according to claim 1, wherein the write line placed between two adjacent memory element columns is shared by the two adjacent memory element columns.

4. A solid-state magnetic memory according to claim 3, wherein the two adjacent memory element columns are symmetrically placed with respect to the shared write line.

5. A solid-state magnetic memory according to claim 4, further comprising element isolation regions for isolating two adjacent element-selecting devices formed on the substrate, wherein the write line between two adjacent memory element columns is placed directly above the element isolation region.

6. A solid-state magnetic memory according to claim 1, wherein the element-selecting device is a field-effect transistor.

7. A solid-state magnetic memory according to claim 6, wherein two adjacent field-effect transistors share a source region or a drain region, and the write line between two adjacent memory element columns is placed directly above the shared region.

8. A solid-state magnetic memory according to claim 1, wherein the write lines are placed below the memory elements.

9. A solid-state magnetic memory according to claim 1, further comprising a plurality of write bit lines placed substantially orthogonally to the write lines, wherein magnetic fields induced by the currents flowing through the write lines and magnetic fields induced by the currents flowing through the write bit lines are simultaneously applied in the same direction to the memory elements so that the magnetization directions of the memory layers of the memory elements change.

10. A solid-state magnetic memory according to claim 1, further comprising a plurality of write bit lines placed substantially orthogonally to the write lines, wherein magnetic fields induced by the currents flowing through the write lines for determining the magnetization directions of the memory layer and horizontal magnetic fields induced by the currents flowing through the write bit lines are simultaneously applied to the memory elements so that the magnetization directions of the memory layers of the memory elements change, the horizontal magnetic fields being horizontal to the planes of the layers in the memory elements.

11. A solid-state magnetic memory according to claim 10, wherein the bit lines are used as the write bit lines.

12. A solid-state magnetic memory according to claim 1, further comprising a power supply circuit for supplying a current to the write lines, the power supply circuit being a push-pull power supply which pushes the current into the one end of the write line and pulls the current through a drive circuit from the other end of the write line.

13. A solid-state magnetic memory according to claim 1, wherein the memory element is a tunneling magnetoresistive element.

14. A solid-state magnetic memory according to claim 1, wherein each of the two magnetic layers of the memory element comprises a ferrimagnetic material containing a rare-earth element.

15. A method for making a solid-state magnetic memory according to claim 1 comprising the step of forming the write lines by patterning so that the write lines are formed substantially in the same plane.

16. An information apparatus comprising a solid-state magnetic memory according to claim 1 as an internal memory.

17. A solid-state magnetic memory comprising a plurality of memory cells arrayed in a matrix, each memory cell comprising a memory element comprising a magnetoresistive element and an element-selecting device, the magnetoresistive element comprising two magnetic layers and a nonmagnetic layer sandwiched between the magnetic layers, the easy magnetization axis of each magnetic layer being directed perpendicular to the plane of the layer, wherein write lines shared by two adjacent memory element columns are placed, both ends of the shared write lines being joined to the ends of other write lines so that a current flows with two memory element columns therebetween, the other ends of the other write lines being joined to a current supply circuit, and thereby a pair of adjacent memory elements placed at both sides of the shared write line are complementarily operated.

18. A solid-state magnetic memory according to claim 17, wherein one of the two magnetic layers is a memory layer having a low coercive force, and the memory layers of the pair of memory elements placed with the shared write line therebetween are always magnetized in opposite directions.

19. A solid-state magnetic memory according to claim 17, further comprising write bit lines placed substantially orthogonally to the write lines, wherein magnetic fields induced by the currents flowing through the write lines for determining the magnetization directions of the memory layers and horizontal magnetic fields induced by the currents flowing through the write bit lines are simultaneously applied to the pair of memory elements so that the magnetization directions of the memory layers of the memory elements change.

20. A solid-state magnetic memory according to claim 17, wherein the memory comprises a plurality of memory sections sharing write lines, each memory section comprises plural memory elements comprising pairs of memory elements which share the write lines and complementarily operate, and each memory section comprises a sense amplifier for sensing the resistance of the pair of memory elements which complementarily operate, the sense amplifier being shared by plural memory element.

21. A solid-state magnetic memory according to claim 20, wherein a pair of memory elements which share a write line and complementarily operate are selected from each memory section, and writing is performed simultaneously in the plurality of memory sections, and thereby a plurality of data are simultaneously written.

22. A solid-state magnetic memory according to claim 20, wherein the sense amplifiers in the individual memory sections are simultaneously driven, and the data of the pairs of memory elements sharing the write lines in the individual memory sections are simultaneously read, and thereby a plurality of bits of data are simultaneously read.

* * * * *